US012730717B2

(12) United States Patent
Mirichigni et al.

(10) Patent No.: US 12,730,717 B2
(45) **Date of Patent: *Sep. 8, 2026**

(54) ECC CONFIGURATION IN MEMORIES

(71) Applicant: Micron Technology, Inc., Boise, ID (US)

(72) Inventors: Graziano Mirichigni, Vimercate (IT); Christophe Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 39 days.

This patent is subject to a terminal disclaimer.

(21) Appl. No.: 18/936,548

(22) Filed: Nov. 4, 2024

(65) Prior Publication Data

US 2025/0061023 A1 Feb. 20, 2025

Related U.S. Application Data

(63) Continuation of application No. 17/802,053, filed as application No. PCT/IB2021/022216 on Sep. 23, 2021, now Pat. No. 12,135,610.

(51) Int. Cl.
*G06F 11/10* (2006.01)
*G06F 11/07* (2006.01)
(Continued)

(52) U.S. Cl.
CPC ...... *G06F 11/1076* (2013.01); *G06F 11/0703* (2013.01); *G06F 11/1016* (2013.01);
(Continued)

(58) Field of Classification Search
CPC ............. G06F 11/1076; G06F 11/0703; G06F 11/1016; G06F 11/1024; G06F 11/1044;
(Continued)

(56) References Cited

U.S. PATENT DOCUMENTS 12,135,610 B2 * 11/2024 Mirichigni .......... G06F 11/0703
2010/0058151 A1 3/2010 Parker et al.
(Continued)

FOREIGN PATENT DOCUMENTS

KR 10-2014-0005757 A 1/2014

OTHER PUBLICATIONS

Chen, et al., Configurable-ECC: Architecting a Flexible ECC Scheme to Support Different Sized Accesses in High Bandwidth Memory Systems, May 2019 IEEE, vol. 68, No. 5, pp. 646-659. (Year: 2019).
(Continued)

*Primary Examiner* — John J Tabone, Jr.
(74) *Attorney, Agent, or Firm* — Brooks, Cameron & Huebsch, PLLC

(57) ABSTRACT

The present disclosure relates to a method for operating an array of memory cells, the method comprising storing user data in a plurality of memory cells of the array, storing parity data associated with the user data in a plurality of parity cells of the array, and, based on the stored parity data, selecting an Error Correction Code (ECC) correction capability and/or an ECC granularity according to which an ECC operation is to be performed, wherein the selection of the ECC correction capability and/or the ECC granularity is determined by the steps of updating a first register, said first register comprising values which indicate a required ECC correction capability and/or a required ECC granularity to be applied to the memory cells based on a current status of said memory cells, wherein the values of the first register are updated based on a variation of the current status of the memory cells, and wherein an update of the values of the first register corresponds to a variation of the required ECC correction capability and/or a required ECC granularity to be applied to said memory cells, and based on the updated values of the first register, executing an ECC switch command, wherein the
(Continued)

ECC switch command is such as to vary a previously selected ECC correction capability and/or a previously selected ECC granularity, the method further comprising: updating a second register according to the varied ECC correction capability and/or ECC granularity, said second register comprising values indicating the selected ECC correction capability and the selected ECC granularity applied to the memory cells based on the current status thereof. Related apparatuses and systems are also herein disclosed.

20 Claims, 16 Drawing Sheets

(51) Int. Cl.

*G11C 29/04* (2006.01)
*G11C 29/42* (2006.01)
*G11C 29/52* (2006.01)

(52) U.S. Cl.

CPC ...... *G06F 11/1024* (2013.01); *G06F 11/1044* (2013.01); *G06F 11/1048* (2013.01); *G06F 11/1068* (2013.01); *G06F 11/1096* (2013.01); *G11C 29/52* (2013.01); *G11C 2029/0411* (2013.01); *G11C 29/42* (2013.01)

(58) Field of Classification Search

CPC ............ G06F 11/1048; G06F 11/1068; G06F 11/1096; G11C 29/52; G11C 29/42; G11C 2029/0411

USPC ....... 714/774, 763, 766, 768, 769, 770, 773, 714/800

See application file for complete search history.

(56) References Cited

U.S. PATENT DOCUMENTS

| | | | | |
|---|---|---|---|---|
| 2013/0086454 | A1 | 4/2013 | Rub | |
| 2013/0283122 | A1 | 10/2013 | Anholt et al. | |
| 2015/0199233 | A1 | 7/2015 | Pelley et al. | |
| 2016/0188405 | A1* | 6/2016 | Li | G11C 29/52 714/755 |
| 2021/0294692 | A1* | 9/2021 | Chen | G06F 9/30189 |
| 2024/0194284 | A1* | 6/2024 | Laurent | G11C 29/52 |
| 2024/0211347 | A1* | 6/2024 | Mirichigni | G06F 11/1068 |
| 2025/0061023 | A1* | 2/2025 | Mirichigni | G06F 11/1016 |

OTHER PUBLICATIONS

Hong, et al., Flexible ECC Management for Low-Cost Transient Error Protection of Last-Level Caches, June 2016, IEEE, pp. 2152-2164. (Year: 2016).

Hsieh, et al., Adaptive ECC Scheme for Hybrid SSD's, Dec. 2015, IEEE, vol. 64, No. 12, pp. 3348-3361. (Year: 2015).

International Search Report and Written Opinion from related International Patent Application Number PCT/IB2021/022216, dated June 17, 2022, 9 pages.

* cited by examiner

ECC CONFIGURATION IN MEMORIES

PRIORITY INFORMATION

This application is a Continuation of U.S. application Ser. No. 17/802,053, filed on Sep. 23, 2021, which is a U.S. National Stage Application under 35 U.S.C. § 371 of International Application Number PCT/IB2021/022216, filed on Sep. 23, 2021, the contents of which are incorporated herein by reference.

TECHNICAL FIELD

The present disclosure relates generally to the management and operation of an array of memory cells, and more particularly to methods, apparatuses, and systems for improving Error Correction Code (ECC) configuration in memories.

BACKGROUND

Memory devices are used in many electronic systems such as mobile phones, personal digital assistants, laptop computers, digital cameras and the like. Various types of memories are used in memory devices, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memories retain their contents when power is switched off, making them good choices in memory devices for storing information that is to be retrieved after a system power-cycle. In particular, non-volatile memory cells may maintain their stored logic state for extended periods of time even in the absence of an external power source.

In a memory device, information is stored by programming different states thereof. For example, binary devices have two states, often denoted by a logic “1” or a logic “0.” In other systems, more than two states may be stored. In order to access the stored information, a component of the memory device may read, or sense, the stored state. In order to store the information, a component of the memory device may write, or program, the logic state.

Improving memory devices may include increasing memory cell density, increasing read/write speed, increasing reliability, increasing data retention, reducing manufacturing costs, scaling smaller than traditional devices, as well as reducing power consumption.

Memory cells have varying physical and electrical characteristics during their life cycle due to various factors such as number of accesses, quality of the manufacturing process, environmental factors, and the like. Error Correction Code (ECC) is usually calibrated on a defined status of the cells of the memory device (e.g., end-of-life reliability of the cells), and therefore is generally used at its highest correction power. Consequently, there is often an excessive power consumption. It is thus desirable to improve power consumption performances over the entire life of a memory device and to have a better flexibility in the ECC management.

DETAILED DESCRIPTION

With reference to those drawings, methods, apparatuses, and systems for an improved operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Non-volatile memories retain their contents when power is switched off, making them good choices for storing information that is to be retrieved after a system power-cycle. For example, a flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines. Access circuitry can differentiate between different logic states of a memory cell. For example, in case of a memory read, the access circuitry applies a voltage pulse with a particular magnitude and polarity to access lines, which results in an electrical response that dedicated sense circuitry can detect. Detecting electrical responses can include, for example, detecting one or more of a voltage drop (e.g., a threshold voltage) across terminals of a given memory cell of the array, current through the given memory cell, and a threshold event of the given memory cell.

In the present disclosure, the term “coupled” can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

Figure 1:
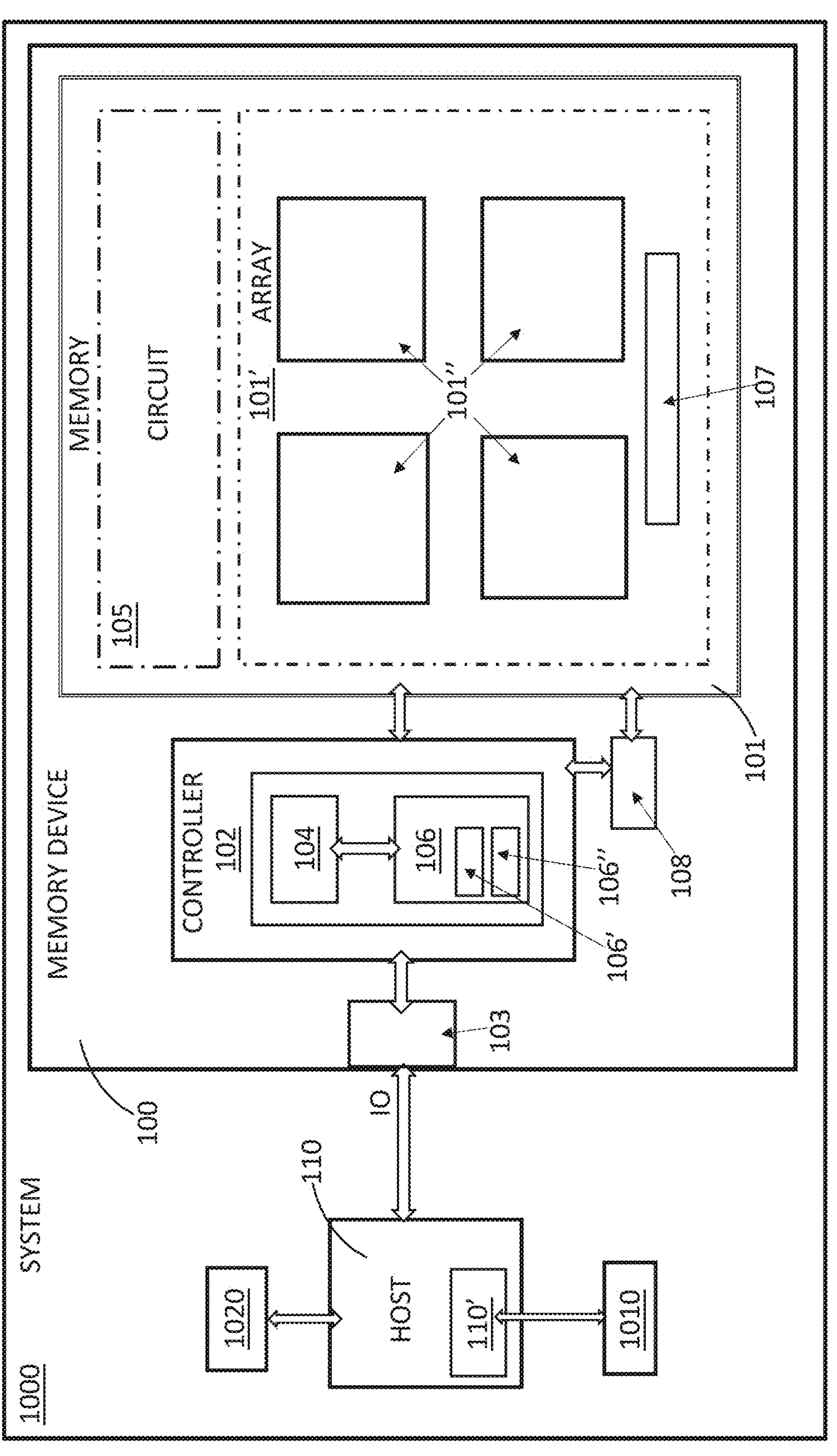
FIG. 1 is a schematic block diagram of a system that may be operated according to the present disclosure.

FIG. 1 is a schematic high-level block diagram of a system 1000 comprising a memory device 100 according to an exemplary embodiment of the present disclosure, this memory device 100 being programmed to perform the ECC techniques disclosed below. The memory device 100 may be a managed memory device, which is herein also referred to as memory apparatus. The memory device 100 can be a solid-state drive (SSD), for instance, and can include a memory section 101, a controller 102, and a host interface 103. The memory section 101 is not limited to a particular architecture and can include different types of memories.

The controller 102 may be coupled to the host interface 103 and to the memory section 101 via a plurality of channels and can be used to transfer data between the memory section 101 and a host 110. The host interface 103 can be in the form of a standardized interface. For example, when the memory device 100 is used for data storage in a computing system, the host interface 103 can be a serial advanced technology attachment (SATA), peripheral component interconnect express (PCIe), or a universal serial bus (USB), among other connectors and interfaces. In general, the host interface 103 can provide an interface for passing control, address, data, and other signals between the memory device 100 and the host 110.

The controller 102 can include an embedded firmware and is adapted to manage and control the operation of the memory section 101. The controller 102 can communicate with the memory section 101 to control data read, write, and erase operations, among other operations. For example, the controller 102 can include a number of components in the form of hardware and/or firmware (e.g., one or more integrated circuits) and/or software for controlling access to the memory section 101 and/or for facilitating data transfer between the host 110 and said memory section 101.

The memory controller 102 thus represents control logic of the device, for example acting in response to command by the host 110 (which may generally be an external managing system of the non-volatile memory). As will be disclosed in the following, in one embodiment, the memory controller 102 can also be implemented in the host 110, in particular as part of a host processor 110', even if the present disclosure is not limited by a particular architecture.

As disclosed in relation to FIG. 1, the memory controller 102 may receive user data through input/output IO. Multiple signal lines couple the memory controller 102 with the memory section 101. For example, such signal lines may include clock, command/address and write data (DQ), read DQ, and zero or more other signal lines. The memory controller 102 may thus be operatively coupled to the memory section 101 via suitable buses.

The memory device 100 can also comprise other components (not shown) such as processor units coupled to the controller 102, antennas, further connection means with the host device 110, and the like. In any case, the present disclosure is not limited by a specific configuration of the memory device 100.

Moreover, the controller 102 can also include its own memory section (not shown) operatively coupled with other units thereof. In any case, the present disclosure is not limited by a particular configuration of the controller 102.

In one embodiment, the memory device 100 may be a portable device configured to be coupled to the host device 110. However, in other embodiments not shown in the drawings, the memory device 100 can also be embedded within one or more host devices. The host 110 may be for example a personal computer, a tablet, a smartphone, a server or the like. The host 110 can include a system motherboard and/or backplane and can include a number of memory access devices (e.g., a number of processors).

In an embodiment, the controller 102 includes an Error Correction Code (ECC) unit 104, also referred to as ECC engine unit (including one or more ECC engines), which is configured to operate according to techniques described in the following.

The ECC unit 104 can include error correction circuitry to detect and correct a number of bit errors, according to embodiments of the present disclosure. The ECC unit 104 is not limited to circuitry (e.g., hardware) implementations. For instance, the ECC unit 104 can be implemented in hardware, firmware, and/or software.

The ECC unit 104 can be embodied by discrete components such as an application specific integrated circuit (ASIC) or by components that reflect functionally provided by circuitry within the controller 102 that does not necessarily have a discrete physical form separate from other portions of the controller 102. Although illustrated as components within the controller 102, the ECC unit 104 can be external to the controller 102 or can have a number of components located within the controller 102 and a number of components located external to the controller 102, wherein the present disclosure is not limited by a specific hardware architecture. The ECC unit 104 can include separate encoding and decoding components, in a number of embodiments.

In other words, the error detection/correction circuitry of the ECC unit 104, which may be programmed as disclosed below, can include hardware logic to implement an ECC to detect errors occurring in data read from memory section 101. In one embodiment, error detection/correction circuitry also corrects errors (up to a certain error rate based on the implemented ECC code).

The memory section 101 of the memory device 100 can include a flash memory including an array of memory cells, for example a NAND memory, NOR memory, AND memory, and the like. Additionally or alternatively, memory section 101 may comprise bit alterable memory cells; for example, Phase Change Memory (PCM), Ferroelectric Memory (FeRAM), Magnetic Memory (MRAM), chalcogenide-based Self-Selecting Memory (SSM), etc. Any kind of memory may be employed in embodiments of the present disclosure. For example, the disclosure applies to either or both non-volatile and volatile memories.

In general, the memory section 101 may comprise an array of memory cells 101'. The array of memory cells 101' may comprise a plurality of blocks, each block being indicated herein with the reference number 101" and comprising a defined number of pages. For the sake of simplicity, only four blocks 101" are shown in the example of FIG. 1.

The memory section 101 represents the memory resource for the memory device 100. In one embodiment, the array of memory cells 101' of the memory section 101 is managed as rows of data, accessed via wordline (rows) and bitline (individual bits within a row) control. The array of memory cells 101' can be organized as separate channels, ranks, and banks of memory, in general in a plurality of portions. Channels are independent control paths to storage locations within memory section. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

According to embodiments of the present disclosure, the array of memory cells 101' may be subdivided according to the needs and/or circumstances, and a page, a single block, a group of blocks, or even all blocks (i.e. all the cells) may be considered, the invention not being limited thereto. The memory cells can thus be grouped, for instance, into a number of blocks including a number of physical pages. A number of blocks can be included in a plane of memory cells and an array can include a number of planes.

Embodiments are not limited to a particular type of memory array or array architecture and the techniques of the present disclosure may be applied to several memory technologies (e.g., planar, cross-point, 3D, etc.).

Memory section 101 may also comprise a circuit portion 105 operatively coupled to the array of memory cells 101', as well as other hardware components.

In one embodiment, the circuit portion 105 includes access circuitry and sense circuitry to detect electrical responses of the one or more memory cells to an applied read voltage. In one embodiment, the sense circuitry includes sense amplifiers. FIG. 1 illustrates the circuit portion 105 as being embedded in the memory section 101; however, other embodiments can include access circuitry and/or sense circuitry that is separate from the memory section 101. For example, access circuitry and sense circuitry can be included in a memory controller such as the memory controller 102.

Furthermore, the memory device 100 may comprise a counting unit 106 configured to account for the status of the memory cells of the array of memory cells 101' and for determining a trigger event to activate the ECC unit 104.

More in particular, the counting unit 106 may comprise a first counter 106' and a second counter 106". The first counter 106' may be configured to account for the lifetime of the array of memory cells 101' (or of portions thereof), as it will be disclosed below. For example, the first counter 106' may be apt to count the number of accesses, or the number of refresh events, or the number of power-up events, or a combination thereof, in accordance with embodiments disclosed below. The second counter 106" may be configured to count the number of errors detected by the ECC unit 104, in accordance with embodiments disclosed below.

In the example of FIG. 1, the counting unit 106 is depicted as integrated into the controller 102, even if other architectures are possible and the counting unit 106 may also be external to the controller 102 and connected thereto. In yet other embodiments, the counting unit 106, as well as other components, may be integrated into the memory section 101, which may also comprise its own controller, as well as many other architectures are possible.

Furthermore, the memory device 100, in particular the array of memory cells 101' of the memory section 101, may comprise a non-volatile region 107 apt to store operating information, for example for the management of the memory array according to embodiments disclosed in the following.

In embodiment, the memory device 100 may also comprise a sensing unit 108 comprising one or more sensors operatively coupled to the memory section 101 and optionally to the controller 102. The sensing unit 108 may be configured to detect a feature (e.g. the temperature) of the array of memory cells 101' or of a portion thereof. The sensing unit 108 may also be integrated in the memory section 101, in some embodiments, even though the present disclosure is not limited by a specific hardware architecture.

Generally, the particular architecture of the memory device 100 may vary according to the needs and/or circumstances without limiting the scope of the present disclosure.

The host 110 and the memory device 100 may form a system 1000. As mentioned before, the host device 110 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The host 110 may generally be a system managing the memory section 101, which may be embedded in said system or generally managed by said system. The memory device 100 may thus be managed by an external controller (and therefore not only by controller 102), i.e., the controller embedded in the processor 110' of the host 110, as previously disclosed, so that the ECC unit may also be included in said external controller. In this case, the controller of the memory device may not be present (or may perform different tasks) and the memory device 100 (which may be embedded in the host 110) communicates the required information to the external controller.

In one embodiment, the system 1000 includes an interface 1010 coupled to the processor 110', which can represent a higher speed interface or a high throughput interface for system components that needs higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1020 communicatively coupled to the host or to memory device for example for connecting with other systems, and/or a battery coupled to provide power to said system.

According to the present disclosure, the ECC unit 104 may be configured to perform an ECC operation (detection and/or correction of errors) with a certain error correction capability on a codeword stored in the memory section 101, wherein the codeword includes a certain number of parity bits, as it will be disclosed in the following.

Figure 2:
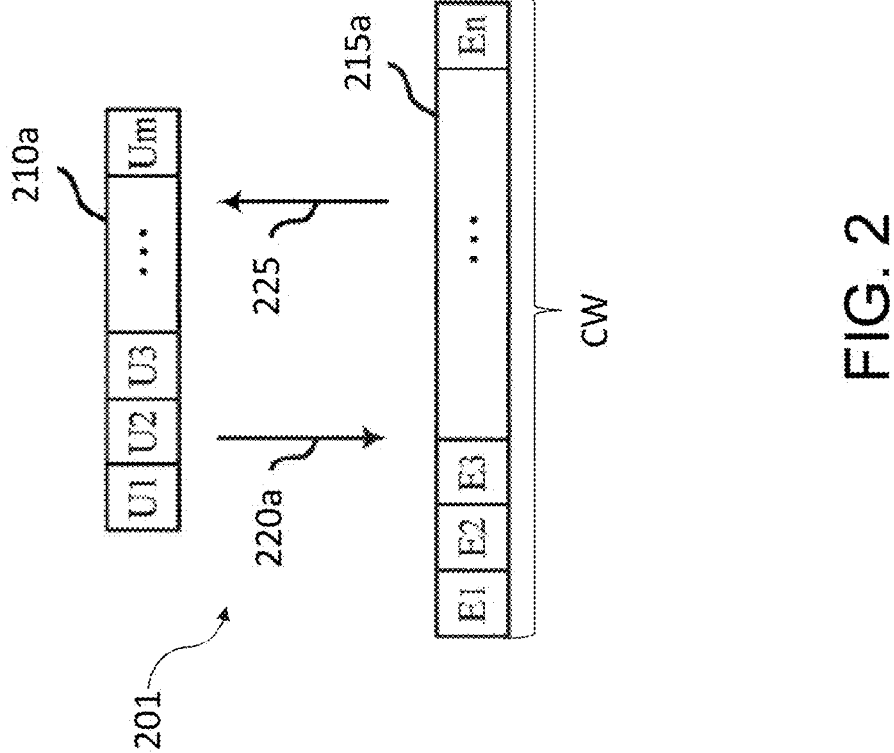
FIG. 2 is an example of user data pattern encoded according to embodiments of the present disclosure.

FIG. 2 illustrates an exemplary user data pattern diagram 201. The user data pattern diagram 201 includes user data *210a* and encoded user data *215a*. Encoding process *220a*, which is performed in the programming phase of the array of memory cells, may convert the user data *210a* (U1, . . . , Um) into the encoded user data *215a* (E1, . . . , En). The encoded user data *215a* may be stored in a set of memory cells, which may be, for example, memory cells of the memory section 101 of FIG. 1. Each box of the encoded user data *215a* may correspond to a memory cell that may exhibit a logic state of 1 or a logic state of 0. In embodiments of the present disclosure, during the encoding process *220a*, a number of parity bits may be added to the user data *210a*. A number of bits in the encoded user data 215*a* may be greater than the number of bits in the user data 210*a* (e.g., n is larger than m if some bits, e.g. parity bits, are added). Process 225 may convert the encoded user data 215*a* back to the user data 210*a* after the encoded user data 215*a* have been accurately read.

In an embodiment, the plurality of encoded bits to be read represents a codeword (CW). The codeword may be programmed to include various information to be used during the reading phase. In order to keep a smooth and simple description, in the following reference will be made to ECC-related information only. It is understood that the additional bits may include not strictly ECC-related information, though. Examples may include encryption bits, scrambling bits, bits for balanced or quasi-balanced codes (e.g., to achieve a predefined percentage, or within a percentage range, of bits in a given logic state, such as 50% of 1s or 0s), and/or other purpose additional bits.

As mentioned before, when data are stored in memory cells (such as the array of memory cells 101' of FIG. 1), data are encoded in such a way that a decoder can identify and correct errors, i.e. data strings are encoded by adding a number of parity bits. When the original data is to be reconstructed, the decoder examines the encoded message to check for any errors. In certain embodiments, a block of user data bits is encoded to become a block of n bits (i.e., the codeword CW), as shown in FIG. 2. However, various encoding schemes are possible.

During the lifetime of the memory array, the Bit Error Rate (BER) associated to the data stored in the memory cells evolves based on several factors, such as, for example, a number of accesses to the memory cells, retention time, process quality, environment (space, power supply voltage, operating and storage temperature, etc.), and the like. For some technologies, the BER is typically better at the beginning of the die life and worst at the end of life, while, for some others, the BER could be better after some cycles (e.g., after a forming procedure) than at the beginning and at the end of life of the die.

The present disclosure provides techniques to tailor the evolution of the BER and to select the proper protection based on the current status of the memory cells. In other words, the present disclosure provides a technique to precisely define the ECC correction capability (or ECC protection level) and the ECC granularity to be applied to the cells of a memory array according to the status thereof. In the context of the present disclosure, the "status" of a cell is meant as its operating condition or generally its health, and is therefore related to physical parameters indicating the condition of the memory cells (e.g., is related to the BER). As mentioned above, often the status of a memory cell or a plurality of memory cells may depend on several present and past parameters. The principles of the present disclosure and the disclosed architectural features may thus be applied to several types of volatile or non-volatile memories which show a time-varying status of their memory cells.

According to embodiments of the present disclosure, on the basis of the encoding scheme, a codeword is generated (e.g., as in process 220*a*) manipulating the user data bits and adding a number of parity bits (the more potential errors are to be detected and corrected, the more parity bits are necessary). The ECC unit 104 may then generate the codeword according to a selected ECC protection level and to a selected ECC granularity. Based on the decoding scheme, an ECC syndrome is produced from the encoded set of user and parity data, for instance by means of the ECC unit 104 of FIG. 1. The ECC syndrome changes depending on the presence and location of errors. When errors are detected, the ECC unit 104 is able to correct said errors up to and according to the implemented correction capability. In some cases, the presence of an uncorrectable error (e.g., the location of which is unknown) may be reported. As it will be discussed in the following, the applied ECC protection level and/or ECC granularity may vary in operation.

The number of stored parity bits and the maximum ECC correction capability are intrinsically tied to each other. During the configuration of a memory section of a device (such as for example memory section 101 of FIG. 1, or a portion thereof), a number of parity bits may be allocated for storing the parity information and to perform ECC techniques for detection and correction of errors. As it will be discussed in the following, in some embodiments the number of parity bits may be fixedly allocated, while in other embodiments said number may be varied along with the status of the memory cells. In any case, at read back, the codeword (including user data and parity bits) is accessed and decoded according to a selected ECC scheme. An ECC engine unit (such as ECC unit 104 of FIG. 1, which may be implemented in hardware, for example) with a given maximum correction capability may operate at different correction capabilities, each requiring a corresponding number of parity bits. For example, less or more parity bits may be considered (either in encoding or decoding) for a lower or higher ECC protection level and for different ECC granularities, respectively; correspondingly, a smaller or higher power is consumed.

Advantageously, according to embodiments of the present disclosure, the ECC correction capability and the ECC granularity is selectable based on the status of the memory cells of the array. In other words, the ECC protection is dynamically adapted to the memory cell health and varied (e.g., increased or in some cases decreased) only when necessary, i.e. when the status of the memory cells requires it. Therefore, according to embodiments of the present disclosure, when user data (i.e. the payload content of a codeword) are stored in a plurality of memory cells of the memory array, also parity data are stored in parity cells of the memory array associated with the user data, and the number of parity bits that is used during ECC operations is selected based on the status of the plurality of memory cells.

Figure 3:
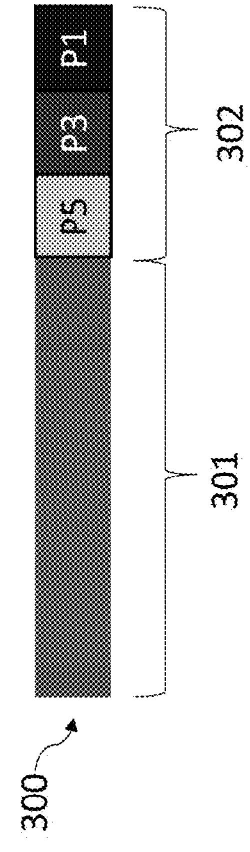
FIG. 3 shows an exemplary codeword including a number of parity bits.

As shown in FIG. 3, an exemplary codeword 300 may comprise a first codeword portion 301 corresponding to the payload (thus including encoded user data), and a second codeword portion 302 corresponding to the parity data. It is noted that such a distinction may be somehow arbitrary; as a matter of fact, an encoding process (such as process 220*a* in FIG. 2) may combine and mix the user data and the parity data so that the codeword as a whole should be considered, as it will disclosed in the following in relation to FIG. 5.

When a minimum protection is needed, only a reduced number of parity bits may be used, for example to calculate syndrome corresponding to ECC1 (ECC1 may be an error correction code with correction capability of 1 bit, in some examples). When ECC protection has to be increased, an increased number of parity bits may be used, for example to calculate syndrome corresponding to ECC2 (ECC2 may be an error correction code with correction capability of 2 bits, in some examples). When protection has to be at a maximum level, an even greater number of parity bits may be used, for example to calculate syndrome corresponding to ECC3 (ECC3 may be an error correction code with correction capability of 3 bit, in some examples).

It should be understood that, while the present disclosure relates to three levels of protection (e.g., ECC1, ECC2 and ECC3), any number may be conceived. For example, embodiments with higher (e.g., N>3) error correction capability and/or embodiments featuring no ECC protection at all (e.g., no parity bit added to the codeword for the purpose of error correcting it) are possible. More in particular, in the following description, reference will be made to a nonlimiting example in which three ECC engines may be used on each partition of the memory device, e.g., ECC1, ECC2 and ECC3, wherein each ECC engine may operate on a 16-byte, 32-byte or 64-byte ECC granularity. Moreover, in this nonlimiting example, read/write access granularity could be 16-byte, 32-byte or 64-byte, regardless of the selected ECC engine and ECC granularity. The read/write granularity could be chosen on the fly, or through a configuration register, in various embodiments. During the lifetime of the device, the use of an ECC Engine and/or ECC Granularity, could be prohibited. It is to be understood that this is only a nonlimiting example to show the techniques of the present disclosure and other ECC correction capabilities, ECC granularities and read/write granularities could be selected according to the needs and/or circumstances. In the context of the present disclosure, ECC granularity may be defined as the data chunk size on which the ECC is defined and operated, and it could by varied dynamically based on the status of the memory cells.

In the example of FIG. 3, the codeword 300 comprises parity bits indicated as P1, P3 and P5, which can be used to perform up to an ECC3 operation. It is observed that, in FIG. 3, a single block of the codeword portion 302 does not necessary correspond to a single cell and may also corresponds to a group of cells, e.g. it generally represents the number of bits to calculate the syndrome for a corresponding ECC protection level.

In one embodiment, the number of stored parity bits is not varied (e.g., the codeword 300 always comprises P1, P3 and P5 parity bits) and the desired ECC protection is selected by using a certain number of said stored parity bits.

In other embodiments, the number of stored parity bits is varied in operation according to the desired ECC correction capability and ECC granularity. In this case, the number of stored parity bits is selected between a maximum number and a minimum number, and the variation of the ECC correction capability and ECC granularity corresponds to a variation of the number of used parity cells. In other words, when the status of the cells requires it, it is possible to store only the parity bits necessary to perform the required ECC operation, therefore reducing the number of memory cells associated with the parity, for example when a lower ECC protection is needed. Advantageously, lowering the ECC protection level (e.g. when the BER is correspondingly low) allows to reduce the number of used memory cells associated with the parity and thus to reduce power consumption.

In any case, when the number of parity bits to be stored is selected, a number of selectable ECC correction capability and ECC granularity combinations is defined. Then, based on the status of the memory cells, the specific ECC correction capability and ECC granularity may be varied, up to a maximum number as allowed by the number of stored parity bits. Each selectable configuration (i.e., each combination of ECC correction capability and ECC granularity) requires a different number of parity bits, which may be stored in the array based on an accepted overhead. For example, when a 7% overhead for each user 16-byte data portion is accepted (corresponding to 18 stored parity bits, which are the parity bits for implementing an ECC2 engine with 32-byte ECC granularity, in some examples) then, based on the status of the cells, the following combinations may be selected: ECC1 and 16-byte ECC granularity, ECC1 and ECC2 and 32-byte ECC granularity, and ECC1, ECC2 and ECC3 and 64-byte ECC granularity. Obviously, a different number of parity bits may be stored according to the needs and/or circumstances, leading to different selection possibilities. The more parity bits are stored, the more configurations are allowed; for example, a greater flexibility may be achieved with a 18.75% overhead (corresponding to 24 stored parity bits for 16-byte data chunks), wherein all combinations between ECC1-ECC3 and 16-byte-64-byte ECC granularity may be enabled. More in particular, in some examples, 7% parity to be used for implementing an ECC2 engine with 32-byte ECC granularity is higher than the parity to be used for implementing an ECC1 with 16-byte ECC granularity, so that 7% overhead on a 16-byte data segment covers ECC1 with 16-byte ECC granularity, but it is not enough for ECC3 with 16-byte ECC granularity.

According to an embodiment of the present disclosure, it is possible to define, based on a desired operation mode, a time evolution of the ECC correction capability, ECC granularity, and also of the write/read data access granularity to be applied to the memory cells. This time evolution may be defined by selecting, for each defined status of the memory cells, a specific combination of ECC correction capability, ECC granularity and write/read data access granularity to applied to said memory cells among the all the selectable ECC correction capabilities, ECC granularities and write/read data access granularities (e.g., among all the capabilities and granularities as allowed by a certain status—e.g., health, of the cells). The maximum number of all the possible enabled combinations may be initially defined by selecting a number of parity bits to be stored based on an accepted overhead, as disclosed before. The total number of possible configurations then varies with time together with the status of the memory cells; for example, if the health of the memory cells degrades with time, also the number of selectable configurations decreases, since lower protection configurations may not be selected anymore in order to obtain the proper error protection.

Figure 4A:
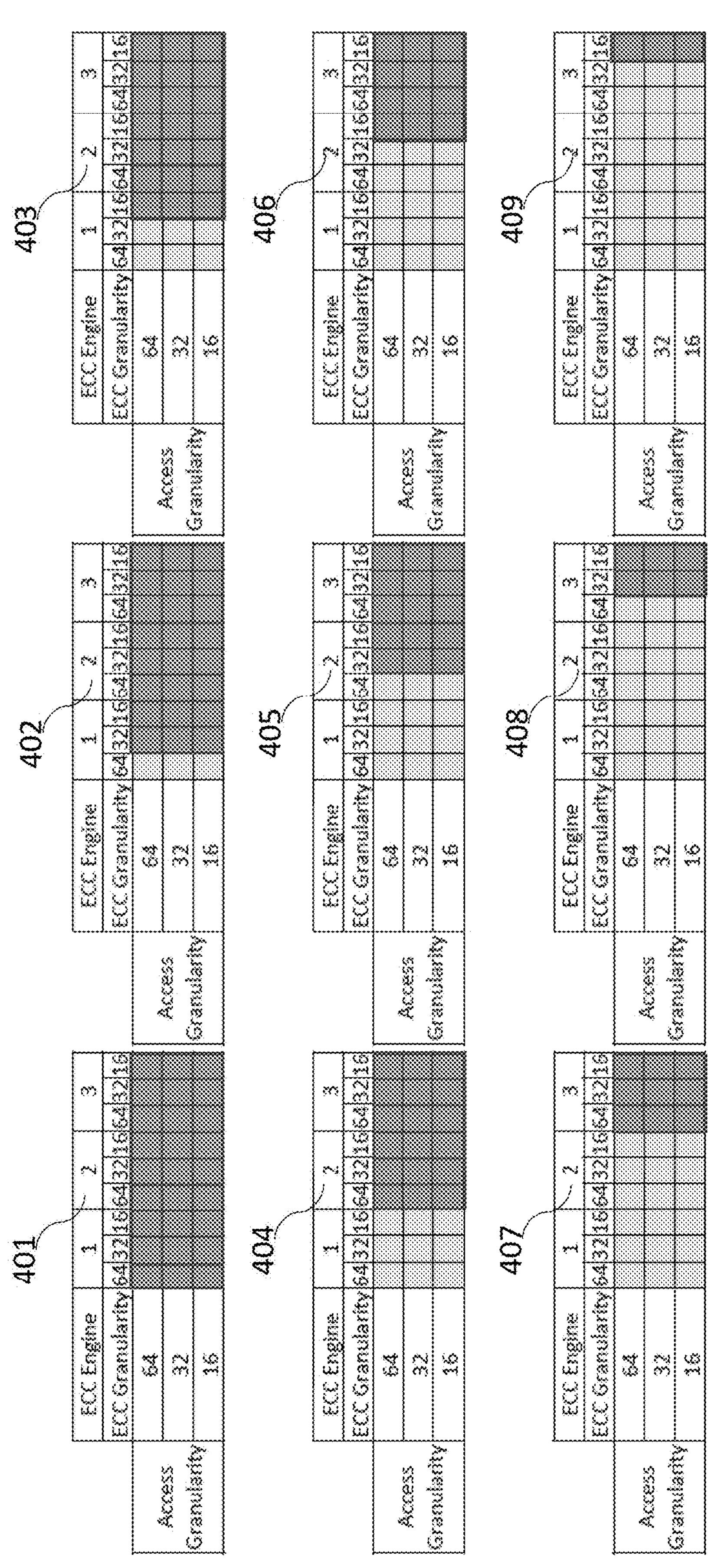
FIGS. 4A-4C show examples of selection of ECC correction capabilities and ECC granularities.
Figure 4B:
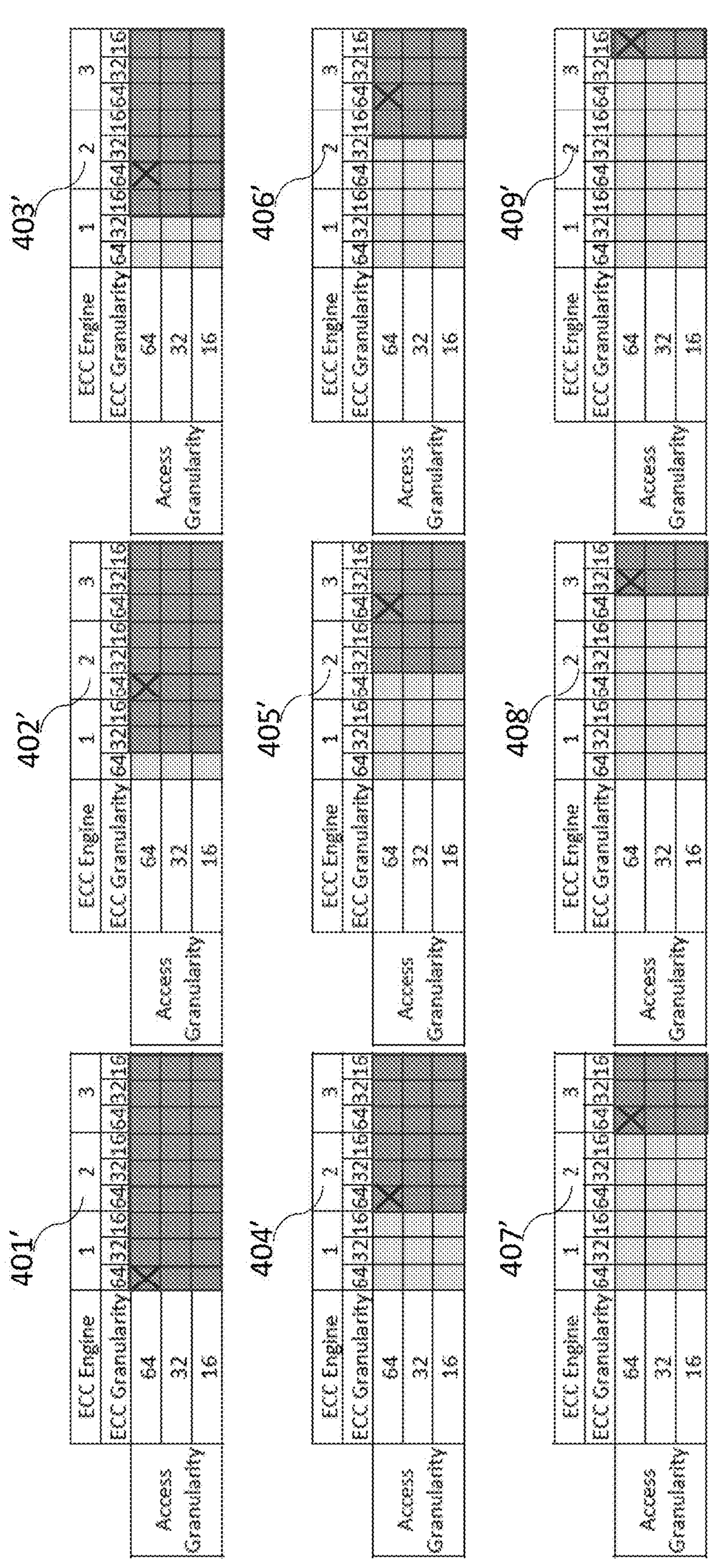
Figure 4C:
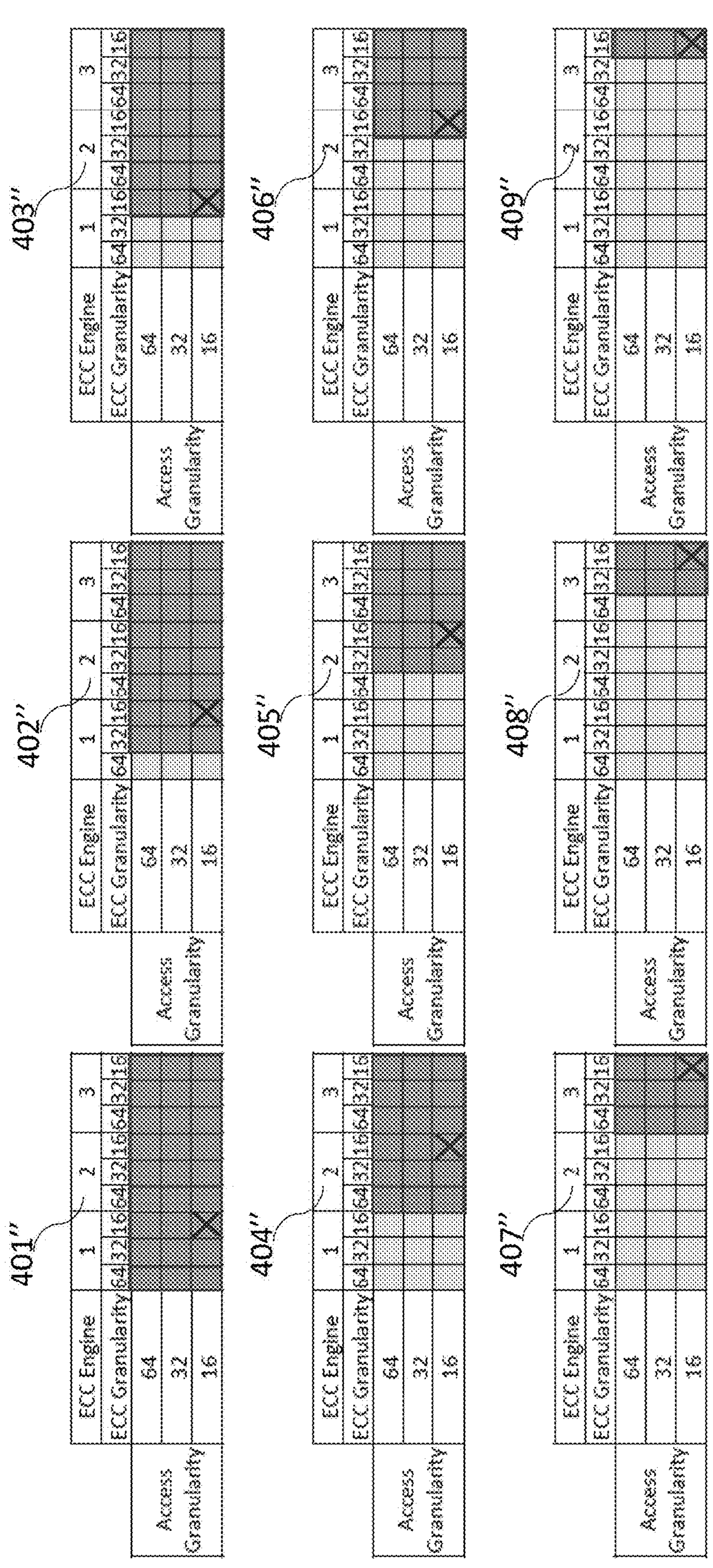

FIGS. 4A-4C show an exemplary evolution scheme of selectable ECC configurations during the device lifetime (from case 401 to case 409), ranging from a status of the cells in which all the configurations are theoretically possible (case 401, where a selection from ECC1 to ECC3 and from 16B to 64B granularity is allowed), to a status of the cells in which only ECC3 on 16B ensures the proper protection (case 409, for example when cells are highly degraded), wherein the darker boxes represent all the selectable configurations and lighter boxes represent the forbidden configurations. In this case, it is assumed that a sufficient number of parity bits is stored in order to enable all the depicted configurations in case 401. It is to be understood that these figures are only examples of possible ECC configurations, and many other configurations may be adopted during the life of the array of memory cells. These figures show that the present disclosure allows an extreme flexibility in the selection of the ECC correction capability and ECC granularity, depending on the cells status and the user's needs. When the cell health degrades, less ECC configurations are selectable, as shown by the lighter boxes of FIG. 4A, which increase in number from case 401 to case 409; in particular, in order to always have an optimum protection from errors when the cell health degrades, only higher ECC engines and/or lower ECC granularities may be selected.

For example, during device lifetime, the configuration may evolve in a sequence according to which, independently on the access granularity: any ECC granularity and any ECC engine may be selected (scheme 401), ECC1 may only be selected for 32 bytes and 16 bytes granularity while ECC2 and ECC3 may be selected for any granularity (scheme 402), ECC1 may only be selected for 16 bytes granularity while ECC2 and ECC3 may be selected for any granularity (scheme 403), ECC1 may not be selected for any granularity while ECC2 and ECC3 may be selected for any granularity (scheme 404), ECC1 may not be selected for any granularity ECC2 may be selected for 32 bytes and 16 bits granularity and ECC3 may be selected for any granularity (scheme 405), ECC1 may not be selected for any granularity ECC2 may be selected for 16 bytes granularity and ECC3 may be selected for any granularity (scheme 406), neither ECC1 nor ECC2 may be selected for any granularity while ECC3 may be selected for any granularity (scheme 407), neither ECC1 nor ECC2 may be selected for any granularity and ECC3 may be selected for 32 bytes and 16 bytes granularity (scheme 408), and, finally, only ECC3 with 16 bytes granularity may be selected (this last configuration requiring the maximum number of stored parity bits).

As the status of the cells varies, the number of possible selectable combinations of ECC engine and granularity (represented by the darker boxes in tables of FIGS. 4A-4C) also vary (in this example, they decrease); for each state, it is possible to choose a combination among the various possible ones, and this choice (indicated by the ticked box) can be made on the basis of a desired target (for example in order to improve power consumption or to improve ECC performances of the system), always ensuring an adequate ECC protection in relation to the status of the cells.

FIG. 4B is an example of an evolution of selectable ECC configurations when better operational performances are desired, wherein the maximum possible granularity (e.g., largest codeword or amount of bits simultaneously corrected) is always selected for each status, as indicated by the ticked boxes in the FIG. 4B. In FIG. 4B, the evolution of the number of all the possible selectable configurations in cases 401'-409' corresponds to cases 401-409 of FIG. 4A, wherein particular selections are shown.

For example, according to FIG. 4B, during device lifetime, the configuration may evolve in a sequence according to which, independently on the access granularity: 64 bytes granularity ECC1 engine may be selected (case 401', when the status of the cells enables any possible configuration), 64 bytes granularity ECC2 engine may be selected in other cases (cases 402'-404', wherein 64 bytes granularity on ECC1 is not selectable anymore due to cell degradation, for example), 64 bytes granularity ECC3 engine may be selected in other cases (cases 405'-409', wherein 64 bytes granularity on ECC2 is not selectable anymore due to cell degradation, for example). According to this choice, performance is preferred with respect to power reduction, for example.

On the other hand, FIG. 4C is an example of an evolution of selectable ECC configurations when a reduction of power consumption is desired, wherein the lowest possible ECC correction capability is always selected for each status of the memory cells, as indicated by the ticked boxes in the FIG. 4C. As seen for FIG. 4B, in FIG. 4C the evolution of the number of all the possible selectable configurations in cases 401"-409" corresponds to cases 401-409 of FIG. 4A, wherein another particular selection is shown.

For example, during device lifetime, the configuration may evolve in a sequence according to which, independently on the access granularity: 16 bytes granularity ECC1 engine may be selected (as in cases 401"-403", wherein the cell health degradation allows in any case to use ECC1 with 16 bytes granularity, since in this example only 64 and 32 bytes granularity are forbidden in cases 402" and 403", respectively), 16 bytes granularity ECC2 engine may be selected in other cases (cases 404"-406"), 16 bytes granularity ECC3 engine may be selected in other cases (cases 407"-409"). According to this choice, power reduction is preferred with respect to ECC performances, for example.

Other choices are obviously possible, and the controller may be programmed to select any desired configuration for any status, the present disclosure thus offering an extreme flexibility.

Summing up, the present disclosure thus provides techniques to tailor the evolution of the BER and to enable a lower ECC protection when the BER is low and to increase said protection when the BER is higher, for example. According to embodiments, user data are stored in a plurality of memory cells of the memory array, parity data associated with the user data are stored in parity cells of the memory array, and a number of parity bits to be used is selected based on a status of the memory cells and is related to a selected ECC correction capability and ECC granularity. An ECC unit, that has a defined maximum error correction capability (either hardware or software limited) may thus be operated to an inferior error correction capability corresponding to the used number of parity bits. Said it differently, whenever a lower (or higher) ECC protection level is desired, a corresponding number of parity bits is used (which may be accomplished by storing a determined fixed number of parity bits and using only those bits required by the status of the cells, or by storing each time exactly the required number of parity bits). The ECC correction capability and granularity may be dynamically changed during the lifetime of the device; correspondingly, the number of used parity bits is adaptively changed so as to allow the ECC engine to work at the desired level. An ECC operation on the plurality of memory cells is then performed with the corresponding selected level of protection from errors. As an example, in some cases, at the start of life of the array, ECC may be used and, at end of life, ECC3 may be used (and therefore an increased number of parity bits may be used. However, also different cases are possible, including cases in which at the start of life a maximum ECC protection level is needed and after some cycles (e.g. after seasoning or in general after usage of memory cells), the ECC protection level may be reduced. Likewise, ECC granularity may be changed based on specific requirements of the device.

The reduction of the ECC protection level to the minimum necessary corresponds to better power performance. In other words, generally, the use of a reduced number of parity bits corresponds to a reduced power consumption, since only the necessary ECC circuitry is enabled, said circuitry requiring less power when a lower ECC protection is required.

Figure 5:
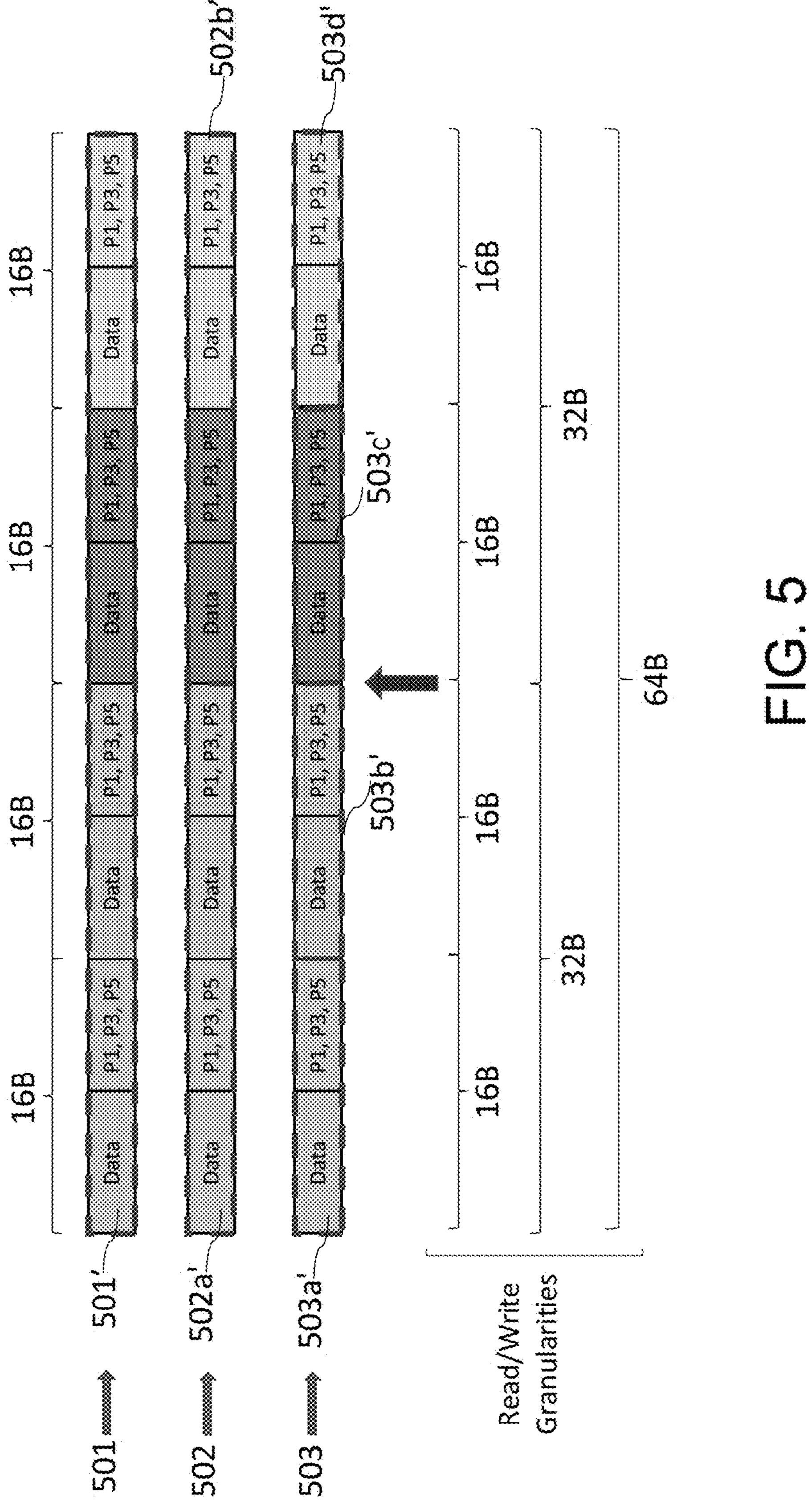
FIG. 5 shows exemplary selectable data configurations according to embodiments of the present disclosure.

FIG. 5 is an exemplary scheme of different selections of ECC granularity and read/write (i.e., data access) granularity to be performed on codewords. More in particular, in example 501, a single codeword 501' may comprise payload data (indicated in the figure as "Data") and parity data P1, P3, P5 (in this example, each depicted codeword may be as codeword 301 of FIG. 3, comprising parity data P1, P3, P5 for performing ECC1, ECC2 and ECC3, wherein in codeword 501' data are mixed). In this example 501, the selected configuration is such that each ECC engine (e.g., ECC1, ECC2 and ECC3) operates on 64-byte chunks (as indicated by the dashed box), i.e. the selected ECC granularity is 64 bytes. On the other hand, in example 502, data are encoded so that each ECC engine (e.g., ECC1, ECC2 and ECC3)

operates on 32-bytes chunks, as indicated by the dashed boxes; in this example 502, the same quantity of payload data and parity data of example 501 is now stored in two different codewords 502_a_' and 502_b_'. In example 503, data are encoded in such a way that each ECC engine (e.g., ECC1, ECC2 and ECC3) operates on 16-byte chunks, as indicated by the dashed boxes; in this example 503, the same quantity of payload data and parity data of examples 501 and 502 is now stored in four different codewords 503_a_', 503_b_', 503_c_' and 503_d_', each corresponding to a 16-byte data chunk.

FIG. 5 also shows in the bottom that different read/write access granularities may be selected, each selection having a different impact. For example, if the selected ECC engine (e.g., ECC1, ECC2, or ECC3) is configured to operate on a 16-byte ECC granularity (as in example 503), a write/read access of 32 bytes or 64 bytes requires the use of the same ECC engine for two times or four times, respectively. On the other hand, if the selected ECC engine is configured to operate on a 64-byte ECC granularity, a read/write access of 16 bytes or 32 bytes is referred only to a portion of said 64 bytes.

According to an embodiment of the present disclosure, start addresses for an access (for example an access of 16-byte, 32-byte or 64-byte) of user data may be fixed, independently from the ECC engine and granularity used, so that there could be no address remapping to access user data when changing ECC engine and granularity. As shown before, in some embodiments, the number of parity bits for each combination could be fixed, or, in other embodiments, it could be variable, for example based on the status of the cells.

According to embodiments of the present disclosure, each of the above exemplary configurations of FIGS. 4A-4C and FIG. 5 (as well as many other possible configurations) may be selected and varied with time based on a specific status of the memory cells, according to techniques that will be disclosed in the following. In particular, in order to perform the aforementioned adaptative variation of the ECC correction capability and ECC granularity based on the status of the memory cells, two registers are stored and updated during the life of the array.

More in particular, according to embodiments of the present disclosure, a first register is stored and comprises bit values indicating a required ECC correction capability and a required ECC granularity to be applied the memory cells based on a current status thereof. The values of the first register are updated during the life of the memory cells based on a variation of the current status of said memory cells, in such a way that an update of the values of the first register corresponds to a variation of the required ECC correction capability and ECC granularity to be applied to the memory cells.

Moreover, according to embodiments of the present disclosure, a second register is stored and comprises bit values indicating the currently selected ECC correction capability and the currently selected ECC granularity applied to the memory cells.

In other words, the first register and the second register are status registers having entries that are updated during the life of the array and used to select the proper ECC correction capability and ECC granularity to be applied to the memory cells. The first register is structured to indicate the ECC correction capability and ECC granularity required by the memory cells at a given time, while the second register is structured to contain the current operating mode of said memory cells.

The data information of the first register are received by a controller (such as for example the controller 102 of FIG. 1) and are used by the controller to generate an ECC switch command apt to cause a variation of a previously selected ECC correction capability and/or ECC granularity. Therefore, according to embodiments of the present disclosure, the ECC switch command is generated based on the updated bit values of the first register, in such a way that the previously selected ECC correction capability and/or the previously selected ECC granularity may be varied by executing said ECC switch command.

As shown previously, in an example, the ECC switch Command may be used to select one of ECC1, ECC2 or ECC3, as well as an ECC granularity of 16B, 32B or 64B on which the selected ECC engine operates. However, it is to be understood that other ECC correction capabilities and ECC granularities may be selected according to the needs and/or circumstances.

In an embodiment, once the ECC switch command has been applied and a memory section (such as memory section 101 of FIG. 1), or a portion thereof, has been reconfigured as requested by the new status of the memory cells, the second register is then updated according to the varied ECC correction capability and/or ECC granularity, in this way accounting for the currently selected ECC correction capability and/or ECC granularity. The second register is thus updated to maintain the information on the current operation mode of the array, which is useful for example in case of an unexpected power loss or generally for retrieval of information by the controller.

In some embodiments, once the current status of the memory cells has changed and the first register has been updated accordingly, the controller is configured to enable or not the switch command, for example based on a pre-set command schedule of the controller. The controller may thus decide if apply or not the required variation of the ECC correction capability and/or ECC granularity.

Generally, when the status of the memory cells changes (e.g., due to a degradation thereof) and the first register is updated, the bit values of the first register are not aligned to the bit values of the second register and the ECC switch command may be such as to align said registers. The update of the first register thus corresponds to a request from the memory section to vary its ECC protection configuration, and the controller may apply the ECC switch command accordingly.

In an embodiment, the ECC switch command is enabled if the required ECC correction capability of the first register does not correspond to the currently selected ECC correction capability of the second register, and/or if the required ECC granularity of the first register does not correspond to the currently selected ECC granularity of the second register.

Furthermore, different portions of the array of memory cells may have a different status and/or may exhibit different defect densities. According to an embodiment of the present disclosure, the memory cells of the array may be grouped into a plurality of portions (or partitions), each portion being assigned a specific ECC protection level based on the status of the memory cells thereof. Different portions may thus have different ECC protection levels as well as a same protection level, depending on the specific circumstances. A "portion" of the array is therefore a group of memory cells having the same ECC protection level. In this way, the array may be split into portions in which the ECC correction capability (and/or ECC granularity) is coherent but could be different from the ECC correction capability (and/or ECC granularity) of another portion.

According to an embodiment, a memory portion may correspond to an internal subdivision like a bank group, a bank, a section or whatever other suitable internal subdivision of the memory. Moreover, the memory portion may also correspond to a specification/host subdivision like a buffer, a page, i.e. a subdivision at high level. In an embodiment, the whole memory array may be coherent in term of ECC correction capability and ECC granularity. In other words, a portion may correspond to one of a codeword, a bank, a bank group, a section of the array, the entire array, or even a buffer, a page, and the present disclosure is not limited by the way the cells are grouped.

The subdivision of the array into several portions, possibly having different ECC protection levels, is better suited to real memory devices.

Therefore, according to the present disclosure, each portion of the plurality of portions may be independently assigned a specific ECC correction capability and/or a specific ECC granularity based on the status of the memory cells thereof.

Figure 6B:
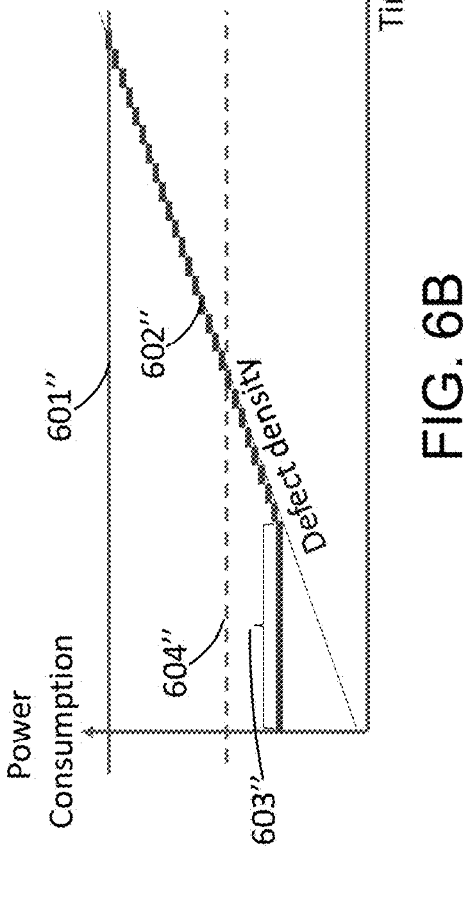
FIGS. 6A and 6B are graphs showing power consumption versus time as a result of techniques according to embodiments of the present disclosure.
Figure 6A:
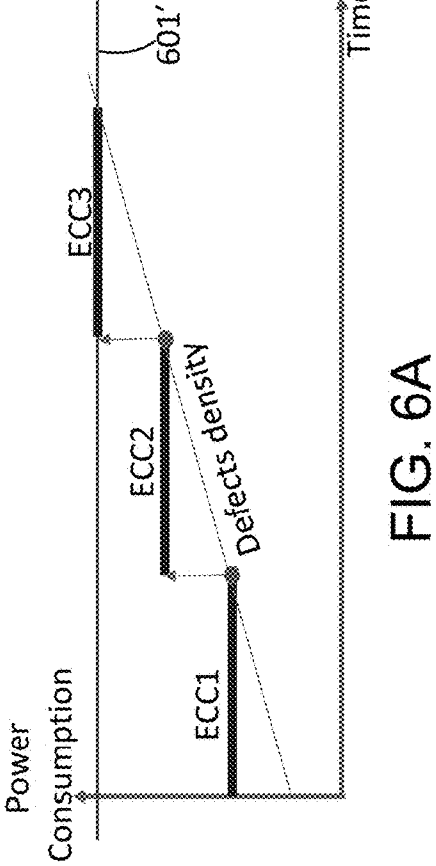

FIGS. 6A and 6B are graphs showing power consumption (on the Y-axis) versus time (on the X-axis), according to embodiments of the present disclosure. It should be noted that, despite time is represented on the X-axis, the concepts herein disclosed are not limited to power consumption evolution vs. time and, rather, they applies to whichever factor that may potentially affect the Bit Error Rate of the memory cells (e.g., cycling, endurance, aging, exposure to high/low temperatures, hard/soft failure mechanisms, voltage drift, etc.; accordingly time is only of many possible examples and the figure should be correspondingly broadly interpreted). In particular, in an example, the time increase of the power consumption may correspond to an increase in the defect density. FIG. 6A shows that ECC protection level may be varied during the life of the memory array; specifically, FIG. 6A is an example of a portion of the array in which the starting protection level is low (e.g. ECC 1, corresponding to a low power consumption), this protection level being increased over time based on the increase in the defect density, e.g., the bit error rate. It is also possible a situation (not shown in the drawings) in which the protection level is lowered over time, depending on the specific technology of the memory adopted. Line 601' of FIG. 6A represents the prior art average cost in terms of used parity bits (e.g., P1, P3 and P5 in case of ECC3, as depicted in FIG. 3) and thus of consumed power, which is always at a maximum level, while according to the present disclosure the average power cost may be significantly reduced, since for a significant period of time the ECC protection level is not at maximum level (e.g., when ECC1 and/or ECC2 are used, respectively requiring using only P1 or only P1 and P3 parity cells and thus activating only the corresponding ECC engines). FIG. 6B represents a case in which the array is divided into multiple independent portions. As in FIG. 6A, line 601" of FIG. 6B represents the prior art average cost in terms of used parity bits (e.g., P1, P3 and P5 in case of ECC3, as depicted in FIG. 3) and thus of consumed power, which is always at a maximum level. In the case of FIG. 6B, each step 602" corresponds to a single portion increasing its ECC protection level, and plateau 603" represents an exemplary initial condition wherein all the portions have minimum protection level (e.g., ECC1, requiring only P1 parity bits, even though a situation in which no ECC is initially implemented is possible) for a duration of time. In this embodiment, the division in multiple portions ensures better performances, as represented by line 604", which is the average power cost, as compared with state of art line 601".

FIGS. 6A and 6B are examples showing a case in which the starting ECC protection level is low and then it is increased over time following the increase in defect density. It should be noted that, for improved graphical representation, the defect density or BER is depicted in FIGS. 6A and 6B as a linearly increasing functions with time (e.g., a line with positive slope). This is not the typical case, and it is understood that any BER variation profile may be considered, linear or not. According to the disclosure, the ECC protection level or correction capability is varied or adjusted based on a variation of the BER (e.g., at any time when it is necessary to do so), therefore insuring the optimal usage of the ECC engine in any circumstance. Alternatively or additionally, depending on the technology, the starting ECC protection level may be higher (e.g., ECC3) at a given moment in time, such as at start of life, and it could be decreased over time (e.g., to ECC2 and/or to ECC1), so that said graphs could also have a decreasing trend.

In any case, according to embodiments of the present disclosure, the ECC correction capability and the ECC granularity is varied (increased or decreased according to the specific technology) with the lifetime of the memory cells based on the time-varying status thereof, which has many benefits in terms of power consumption.

According to an embodiment, the first and second registers are stored in one or more dedicated non-volatile region(s) of the memory array. In other words, the array comprises a non-volatile region adapted to store the data information relating to the selected ECC correction capability and granularity, as well as to the status of the cells (preferably for each portion of the array). For example, with reference to FIG. 1, the non-volatile region dedicated to store said information may be the non-volatile region 107 of the memory section 101. When the array is subdivided into a plurality of portions, respective data information relating to the selected ECC correction capability and ECC granularity for each portion is stored in said non-volatile region (which may be a single region or also may be subdivided into multiple regions of the array).

Figure 7A:
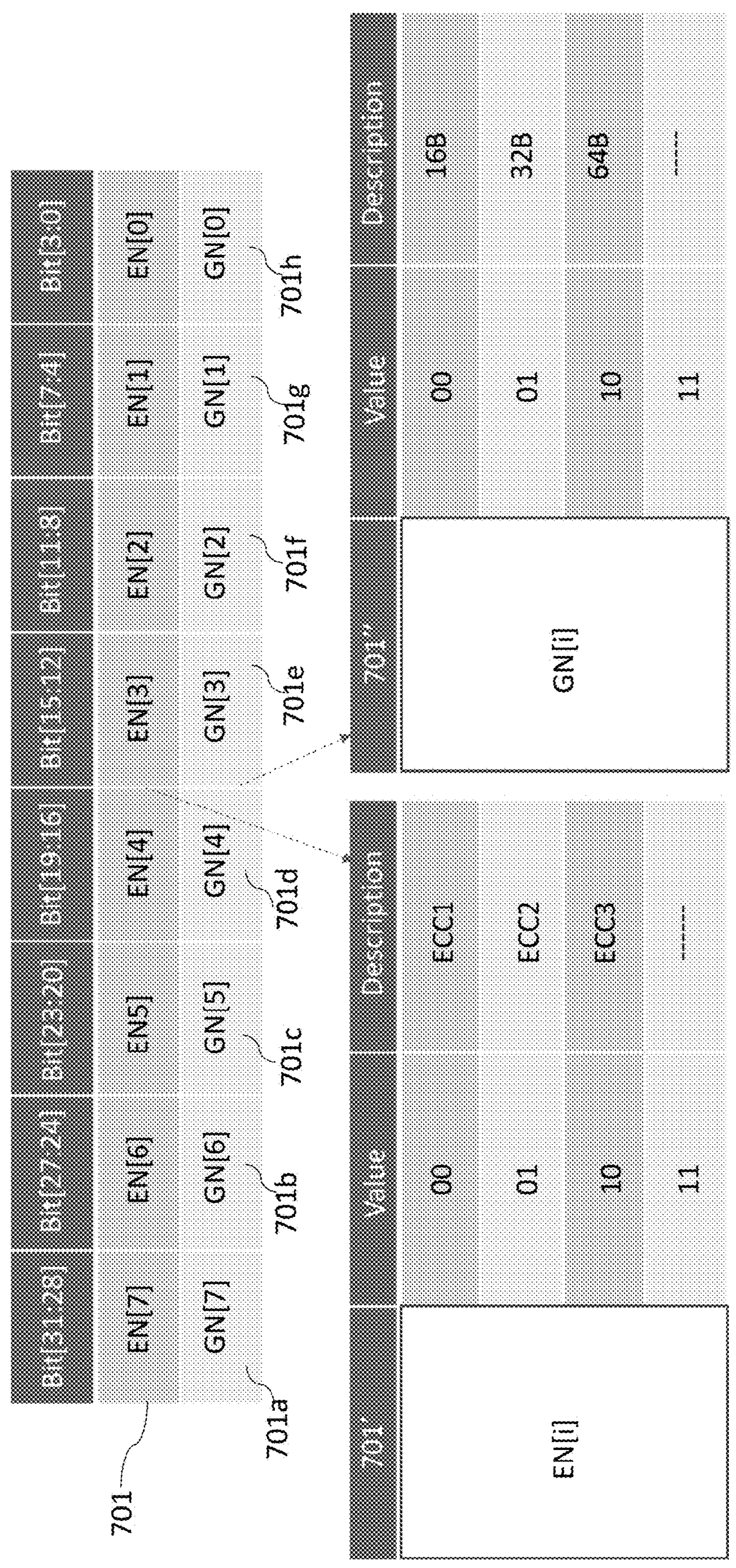
FIGS. 7A and 7B show examples of registers according to embodiments of the present disclosure.
Figure 7B:
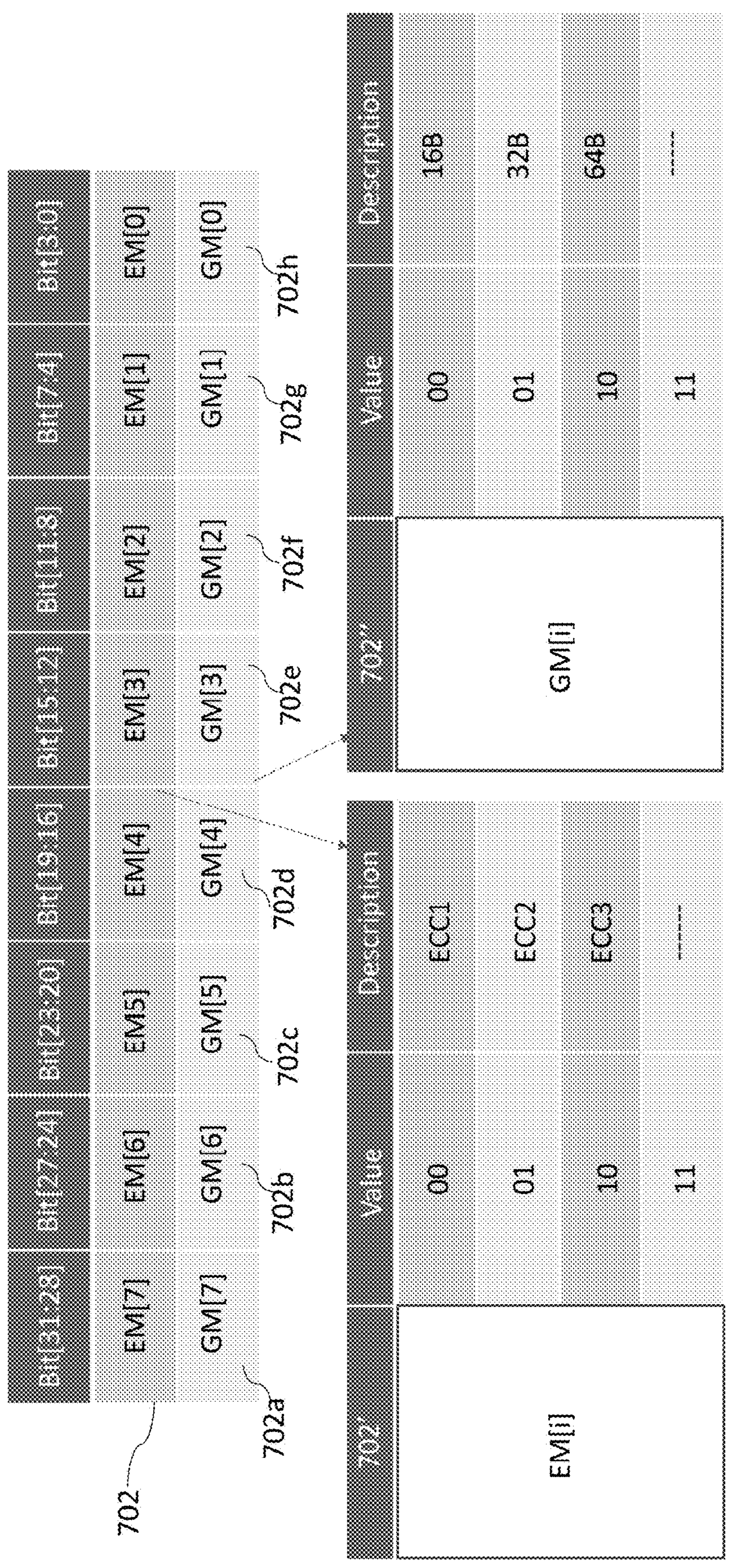

As shown in FIGS. 7A and 7B, the first and second registers are divided into different sections, each section reporting information that relates to a portion of the array. More in particular, as shown in FIG. 7A, the first register 701 comprises a plurality of sections 701*a*-701*h*, each of said sections containing information for a respective portion of the array, the bit values of one section being updated independently from the bit values of the other sections according to the status of the memory cells of the respective portion, i.e., according to the ECC engine and ECC granularity needed by the device at a given time. For the sake of clarity, in FIG. 7A, EN[i] represents the ECC correction capability needed by a portion at a given time and GN[i] represents the ECC granularity needed by a portion at a given time. Furthermore, as shown in FIG. 7B, the second register 702 comprises a plurality of sections 702*a*-702*h*, each of said sections containing information for a respective portion of the array, the bit values of one section being updated independently from the bit values of the other sections according to the currently selected ECC correction capability and/or ECC granularity. For the sake of clarity, in FIG. 7B, EM[i] represents the ECC correction capability selected for a portion and GM[i] represents the ECC granularity selected a portion of the array. It is to be understood that although FIGS. 7A and 7B illustrate a case in which eight partitions are present, the array may be divided into any number of partitions and the registers may have a corresponding number of sections.

According to embodiments of the present disclosure, each section of the first register and the second register comprises four bits. In the nonlimiting example in which each register comprises eight sections, each register uses 32 bits in order to provide the required information, as shown in FIGS. 7A and 7B. For example, in the first register, each section uses two bits to indicate the required ECC engine and two bits to indicate the required ECC granularity per partition. Likewise, the second register uses two bits tov indicate the currently selected ECC engine and two bits to indicate the currently selected ECC granularity per partition. As shown in the nonlimiting examples of the figures, in particular in tables 701' and 702', the bit value 00 may indicate ECC1, the bit value 01 may indicate ECC2, the bit value 10 may indicate ECC3, and the bit value 11 may indicate no ECC. Likewise, as shown in tables 701" and 702", the bit value 00 may indicate 16 bytes ECC granularity, the bit value 01 may indicate 32 bytes ECC granularity, the bit value 10 may indicate 64 bytes ECC granularity, and the bit value 11 may indicate no ECC.

In an embodiment of the present disclosure, one or more look-up tables are stored, so that each possible bit value of the registers 701 and 702 is associated with a respective ECC correction capability and ECC granularity, as shown in tables 701', 701", 702' and 702" of FIGS. 7A and 7B.

Figure 8:
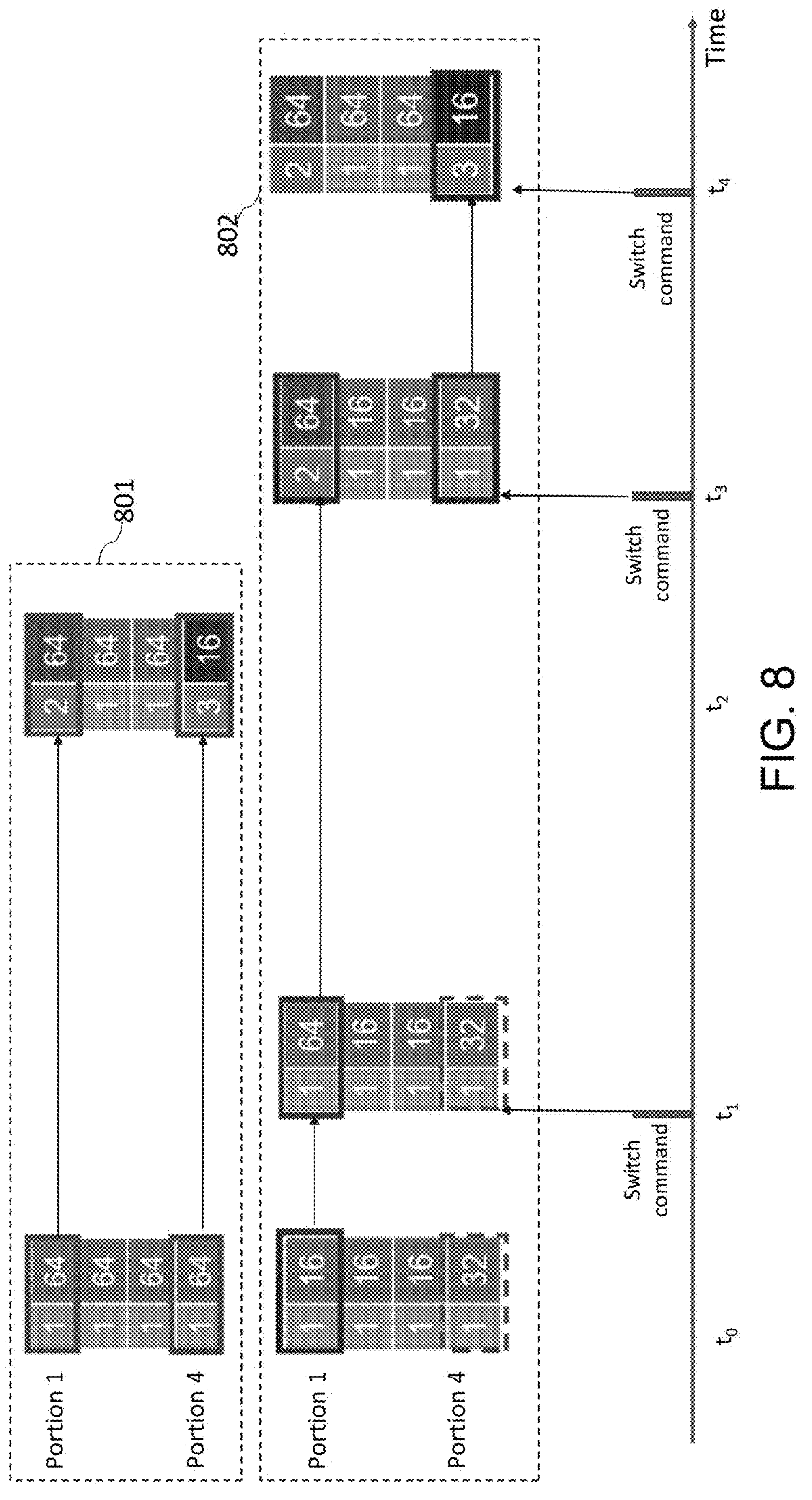
FIG. 8 shows examples of ECC switch command applications according to embodiments of the present disclosure.

FIG. 8 shows examples of switch commands applied to two different portions of the memory array (in this example, applied to partition 1 and partition 4). It is observed that although in this figure the commands are shown as separate, said commands may be sent via a same command bus for all partitions of the memory section. In this example, at time to, partition 1 is protected with ECC1 on a 16-byte granularity and partition 4 is protected with ECC1 on a 32-byte granularity, as shown in block 802, which represents the time evolution of the second register. However, as shown in block 801, which represents the update of the first register, at time to, partition 1 needs to be protected with ECC1 and 64-byte granularity and partition 4 needs to be protected with ECC1 and a 64-byte ECC granularity. For this reason, the controller is configured to send, at time $t_1$, a switch command apt to cause portion 1 to switch from 16-byte granularity to 64-byte granularity. It is observed that, in this example, the controller did not send a switch command to portion 4 at time $t_1$, the controller being configured to decide if enable or not the switch command at a given time, for example based on an internal pre-programmed command schedule as disclosed previously. It is also observed that the first register depicted in block 801 and the second register depicted in block 802 may correspond to registers 701 of FIG. 7A and 702 of FIG. 7B, respectively, wherein in this case only four portions are shown.

Still referencing to FIG. 8, at a certain time $t_2$, partition 1 needs to be protected with ECC2 and 64-byte granularity and partition 4 needs to be protected with ECC3 and a 16-byte granularity, for example as a result of a degradation of the health of the memory cells of said portions, as shown by updated values of block 801. For this reason, the controller is configured to send, at time $t_3$, a switch command apt to cause portion 1 to switch from ECC1 to ECC2, and, at time $t_4$, a switch command apt to cause portion 4 to switch from ECC1 to ECC3 and from 32-byte granularity to 16-byte granularity. This new selected values are then written into the second register, as indicated in block 802.

Therefore, in general, a switch command is sent by the controller in response to a different need of the memory section, as indicated by the first register, this switch command enabling the variation of both ECC correction capability and ECC granularity.

In some embodiments, the controller could prefer an ECC granularity (or ECC protection level) that is not strictly required at that moment by the status (e.g., the heath) of the cells, so that an excess protection may be used, in some examples. For example, still referencing to the example of FIG. 8, 32-byte access granularity aligned with 32-byte ECC granularity may be used, even though the heath or actual error rate of portion 4 would allow to use 64-byte ECC granularity and achieve a higher performance with 64-byte access granularity. In other embodiments, the controller could decide to postpone a switch operation to a moment when there is no read/write data traffic, for example causing a higher BER before the switch operation is completed. Other configurations may also be adopted.

According to an embodiment of the present disclosure, read and/or write operations are not allowed on the memory cells during the execution of the ECC switch command. In this case, when no read/write commands are allowed on the same partition during the switch command, the following read/write commands to the same partition use the new selected ECC engine and/or ECC granularity.

According to another embodiment of the present disclosure, read and/or write operations are allowed on the memory cells during the execution of the ECC switch command, wherein, during the execution of the ECC switch command, the previously selected ECC correction capability and/or ECC granularity is used. When read/write commands are allowed on the same partition during the switch operation, the use of the new selected ECC engine and/or ECC granularity is guaranteed only after said switch operation is completed and, before that, the read/write commands timings may have a degradation because it is still not possible to use the new selected ECC engine and ECC granularity on the entire partition.

In some embodiments, as observed with reference to FIG. 1, ECC circuitry may be integrated in the controller of the memory device, which is properly programmed to execute the ECC techniques of the present disclosure.

Figure 9:
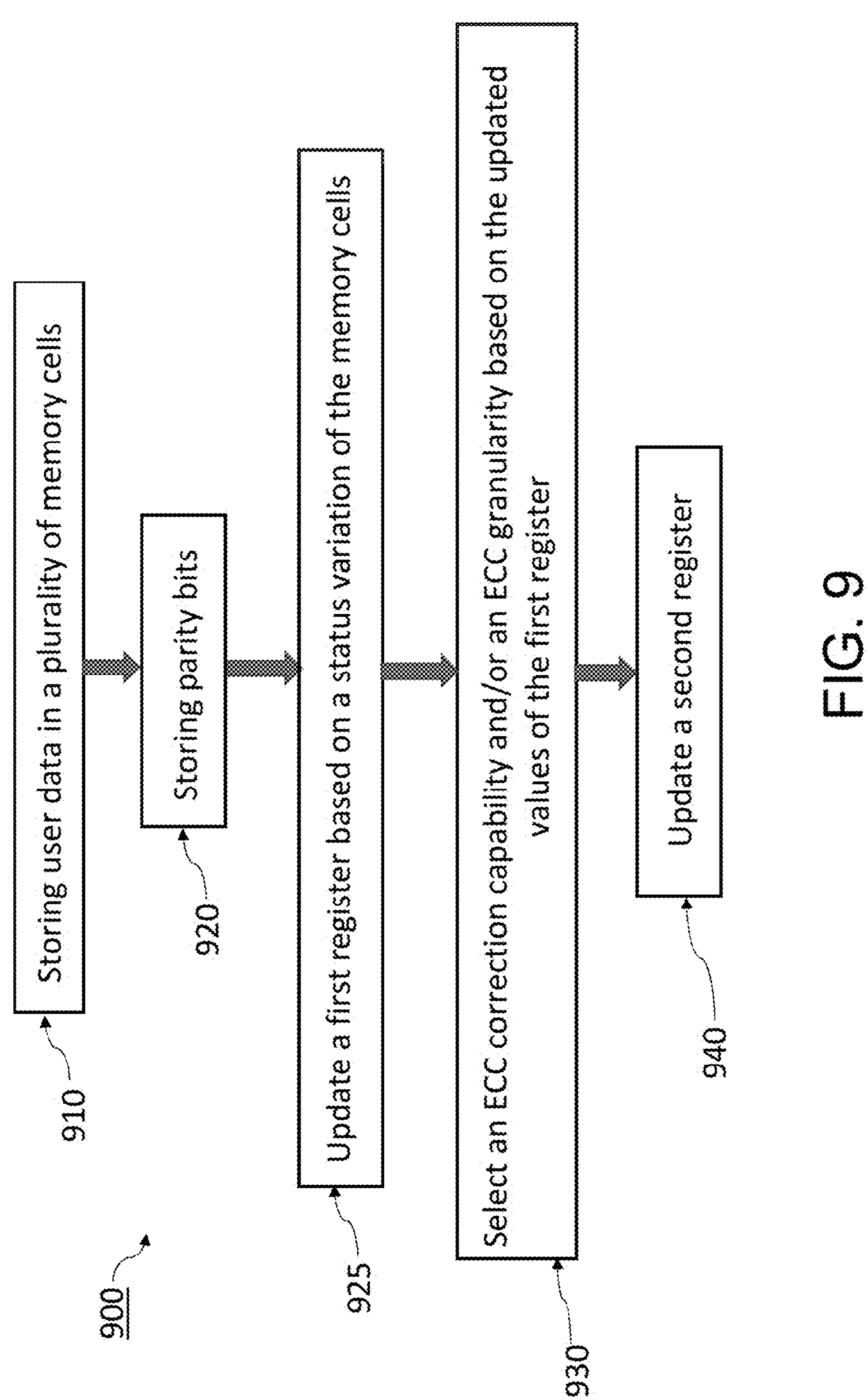
FIG. 9 is a flow diagram of steps of a method according to an embodiment of the present disclosure.

FIG. 9 a is flow diagram representing steps of a method 900 for operating an array of memory cells according to the present disclosure. The processes described can be performed by hardware logic and circuitry. For example, the following processes are described as being performed by access circuitry, sense circuitry and ECC circuitry, as disclosed herein. However, other embodiments can include different circuitry configurations suitable for performing the processes.

The method of the present disclosure is a method for improving the operation of memory cells having ECC protection. Access circuitry writes data to a plurality of memory cells. For example, access circuitry writes logic 0s and logic 1s to a plurality of memory cells such as the memory cells in the memory section 101 of FIG. 1. In one embodiment, access circuitry can write logic 0 by applying programming pulses with a negative polarity and logic 1 by applying programming pulses with a positive polarity. The opposite convention can also be adopted. Different programming pulses may be applied to memory cells, depending on the technology. After writing data to the plurality of memory cells, access circuitry can read the plurality of memory cells and ECC circuitry can verify the presence of errors and correct them.

In particular, at step 910, user data are stored in a plurality of memory cells of the array. Then, at step 920 parity bits associated with the user data are stored in a plurality of parity cells of the array. Based on the stored parity data, an Error Correction Code (ECC) correction capability and/or an ECC granularity is selected at step 930. More particularly, the selection of the ECC correction capability and/or the ECC granularity is determined by updating, at step 925, a first register based on a status variation of the memory cells. Based on the updated bit values of the first register, an ECC switch command is executed to obtain the aforementioned desired selection at step 930. At step 940, a second register is updated according to the varied ECC correction capability and/or ECC granularity, said second register comprising values indicating the selected ECC correction capability and the selected ECC granularity applied to the memory cells based on the current status thereof.

In order to determine the status of the array (or of a portion thereof), and thus to determine when (and how) the ECC protection level should be changed, several techniques or criteria may be implemented, and the device is provided with suitable means.

According to an embodiment, the triggering event may be provided by a counting unit, such as counting unit 106 of the exemplary memory device 100 of FIG. 1. More in particular, as disclosed with reference to the example of FIG. 1, the memory device 100 comprises the first counter 106', which may be configured to account for the lifetime of the memory cells. The first counter 106' is herein also referred to as cycle counter and is configured to count the occurrence of particular events of portions of the array.

In an embodiment, the first counter 106' is configured to count a number of accesses to the memory cells. However, the present disclosure is not limited to counting the accesses to the memory cells, and the first counter 106' may also be configured to count other events, such as a number of refresh events or a number of power-up events or a combination thereof. In any case, in this embodiment, the number of parity cells to be used for defining the proper ECC correction capability (and therefore the proper number of stored parity bits) is selected based on the value of the first counter 106'.

The first counter 106' may be a non-volatile counter accounting for the elapsed lifetime of memory cells, this information being maintained in the memory even after a switch off event thereof.

Figures 10A, 10B:
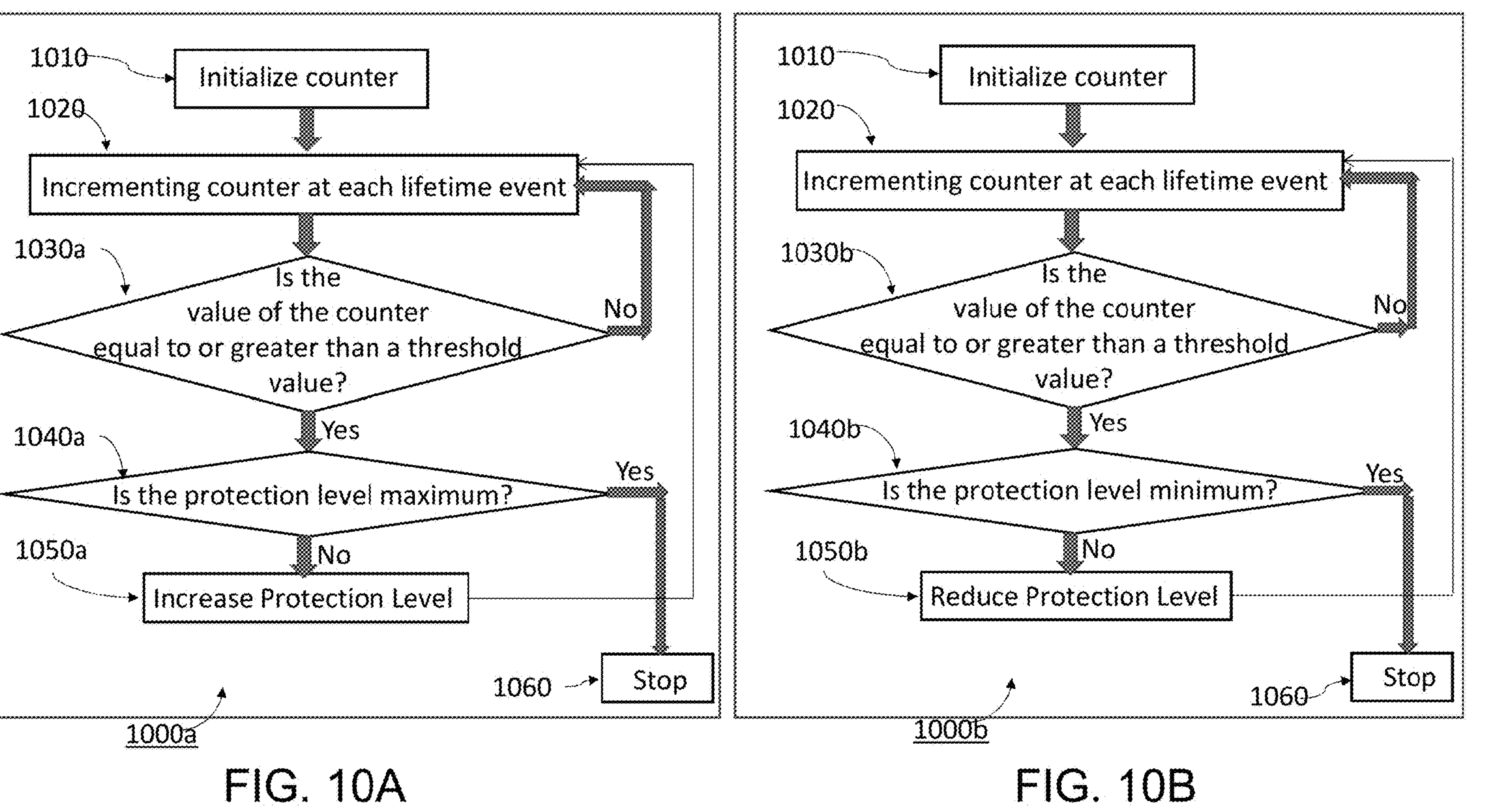
FIGS. 10A and 10B are flow diagrams representing techniques for selecting an ECC protection level based on a lifetime counter, according to different memory technologies.

FIGS. 10A and 10B are flow diagrams 1000*a* and 1000*b* for the selection of the ECC protection level based on the value of the first counter 106' (i.e., based on this lifetime counter). As mentioned before, a lifetime event may be an access to the cells of a portion, as well as many other events. More in particular, FIG. 10A represents a case 1000*a* in which the ECC protection level is increased during the life of the array, while FIG. 10B represents a case 1000*b* in which the ECC protection level is reduced during the life of the array (e.g. in case of memory technologies showing better performances after some cycles). In other words, ECC protection level can be increased or reduced depending on what is expected for a specific technology (which may be mapped in a dedicated Look-up table stored in the memory array). A mixed solution is also possible, in some cases (not shown).

More particularly, method 1000*a* may comprise: initializing the counter (step 1010), incrementing the counter at each lifetime event (step 1020), comparing the value of the first counter to a pre-set threshold value (step 1030*a*), and, when it is not equal to nor greater than this threshold value, continue from step 1020, while, when it is equal to or greater than this threshold value, checking if the protection level is maximum (step 1040*a*) and, if it is not, increasing the protection level (step 1050*a*), while, if the protection level is already at its maximum level, stop (step 1060).

Similarly, method 1000*b* may comprise: initializing the counter (step 1010), incrementing the counter at each lifetime event (step 1020), comparing the value of the first counter to a pre-set threshold value (step 1030*b*), and, when it is not equal to nor greater than this threshold value, continue from step 1020, while, when it is equal to or greater than this threshold value, checking if the protection level is minimum (step 1040*b*) and, if it is not, reducing the protection level (step 1050*a*), while, if the protection level is already at its minimum level, stop (step 1060).

Said differently, the ECC protection level is changed (e.g., increased or decreased) when a counter representative of the usage or lapsed lifetime meets a threshold value, as shown in FIGS. 10A and 10B. Therefore, in this embodiment, the first counter is apt to indicate the status of the memory cells (more particularly the status of the memory cells of the various portions, so that different counters may be implemented for corresponding different portions). For example, a specific counter is associated with a specific portion to trigger a variation of the specific ECC correction capability applied to the respective portions based on the specific usage of the respective memory cells. This technique to select the ECC protection level is herein referred to also as lifetime-based technique.

According to another embodiment of the present disclosure, the memory device comprises also a second counter, such as for example the second counter 106" of FIG. 1, which is configured to count a number of errors detected by the ECC, so that the EEC protection level decision is based on this error bit frequency counter.

As in the case of the first counter 106' (i.e., the non-volatile counter used for example to count the number of accesses), also the second counter 106" may be a non-volatile counter, in some examples.

More in particular, in this embodiment, the number of parity bits used for defining the proper ECC correction capability is selected based a counted error frequency, which is obtained as the ratio of the first counter 106' and the second counter 160" values.

Figure 11:
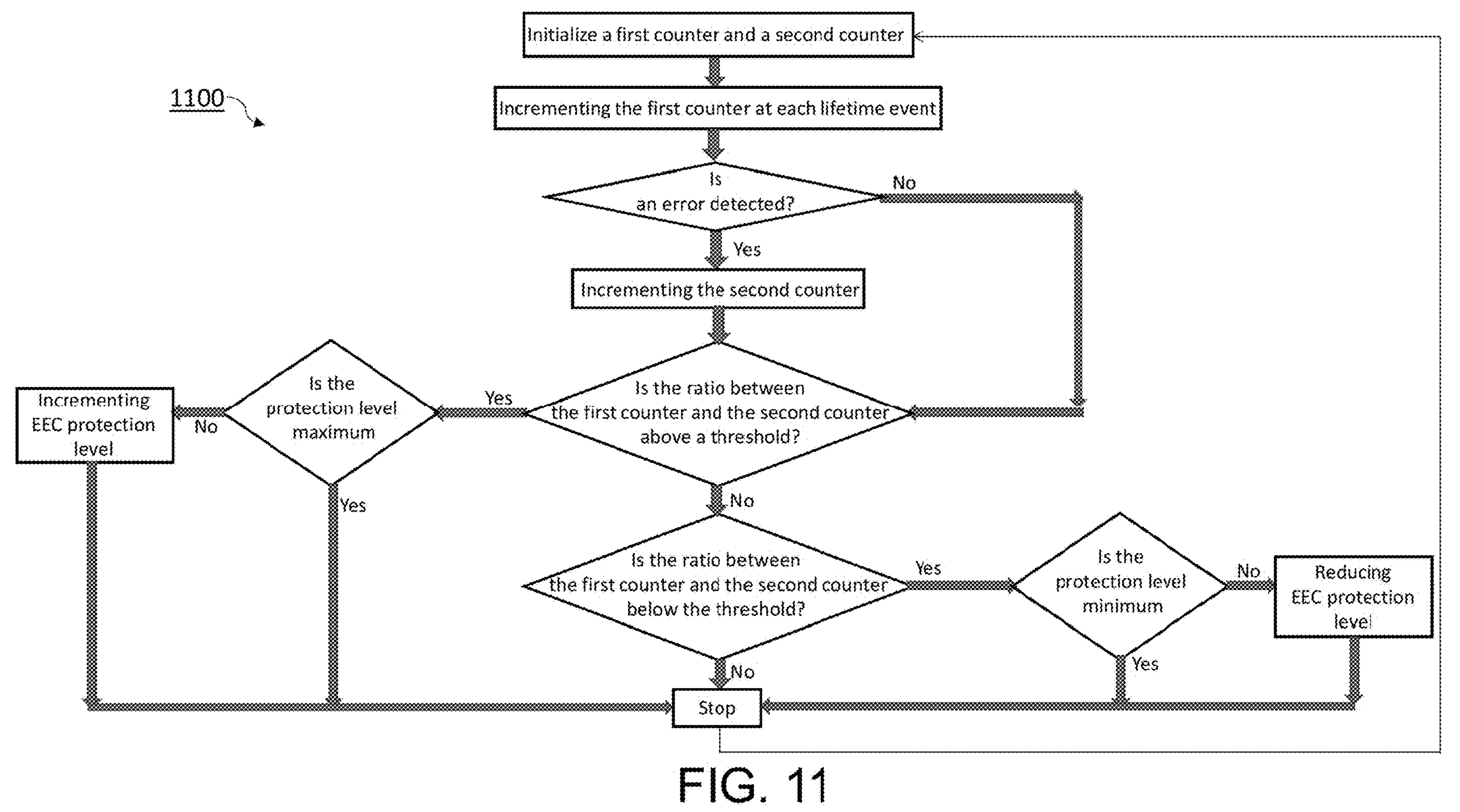
FIG. 11 is a flow diagram representing a technique for selecting the ECC protection level based on a counted error frequency.

FIG. 11 is flow diagram 1100 representing the selection of the ECC protection level based on the counted error frequency.

In particular, the value of the second counter 106" is incremented each time an error is detected by the current implemented ECC. Moreover, each time a lifetime event (e.g., an access) is counted by the first counter 106' (i.e., each time the first counter 106' is incremented), the ratio between the value of the first counter and of the second counter is calculated, yielding the error frequency. This ratio is then compared with a pre-set threshold value.

For example, when the error frequency is greater than the threshold value, the ECC level protection is increased, while when the error frequency is smaller than the threshold value, the ECC level protection is reduced, or vice versa depending on the specific adopted memory technology.

In other words, the number of parity cells used for defining the ECC protection level may be selected based the counted error frequency, which is obtained as the ratio of the content of the first counter and the second counter, the second counter being used to count the number of errors detected by the current ECC. Therefore, in this embodiment, the error frequency indicates the status of the memory cells. This technique to select the ECC protection level is herein referred to also as defectivity-based technique, and it is not limited by the error frequency detection only, and other measurements of defectivity can be used as shown below.

In an embodiment, the counted error frequency may be assigned a different weight depending on the number of errors (e.g., 1, 2 or 3) detected in a same codeword.

As mentioned before, according to the present disclosure, different portions are independently assigned a proper ECC protection level based on their status. Therefore, according to an embodiment, each portion may comprise one or more counter (e.g., the first counter and the second counter) for defining the status thereof. In this way, different counters are associated with different respective portions of the array, each counter being representative of a respective accumulated value (such as number of accesses, number of errors, etc.) for the respective portion, as disclosed above. The ECC protection level variation is thus performed on one or more portions in case the respective accumulated value is equal to or exceeds (or, in other embodiment, is lower than) a threshold value, as seen with reference to FIGS. 10A-10B and 11.

The counter/s may also be updated by host or by internal sensors in order to count array time life, as it will disclosed below.

In any case, the present disclosure is not limited by a specific criterion to determine when the ECC protection level may be changed, and many other techniques are possible.

In some embodiments, a higher protection level may be selected based on an error count during an access operation. For example, detecting one additional error (e.g., with respect to the number of errors previously detected) may trigger an increase of ECC protection level to be applied. In a practical example, if no errors have ever been detected when accessing a codeword, an ECC1 protection level is appropriate (e.g., an ECC correction capability of one error); when an error is detected for the first time, the ECC protection level may be increased to provide ECC2 correction capability in subsequent access operations. Similarly, when a second error is detected, the ECC protection level is further increased, for example to an ECC3 correction capability.

According to an embodiment, the initial status of the memory cells of the array may be defined during sort, e.g., via a testing machine used for evaluating process quality. In this case, the quality of at least one portion of the memory array is firstly tested by means of the testing machine; after the testing operation, the proper number of parity bits to be used for defining the required ECC correction capability is assigned to each portion of the array based on the performed quality test. In other words, testing evaluation may be used to assign a proper starting protection level for each portion.

Figure 12:
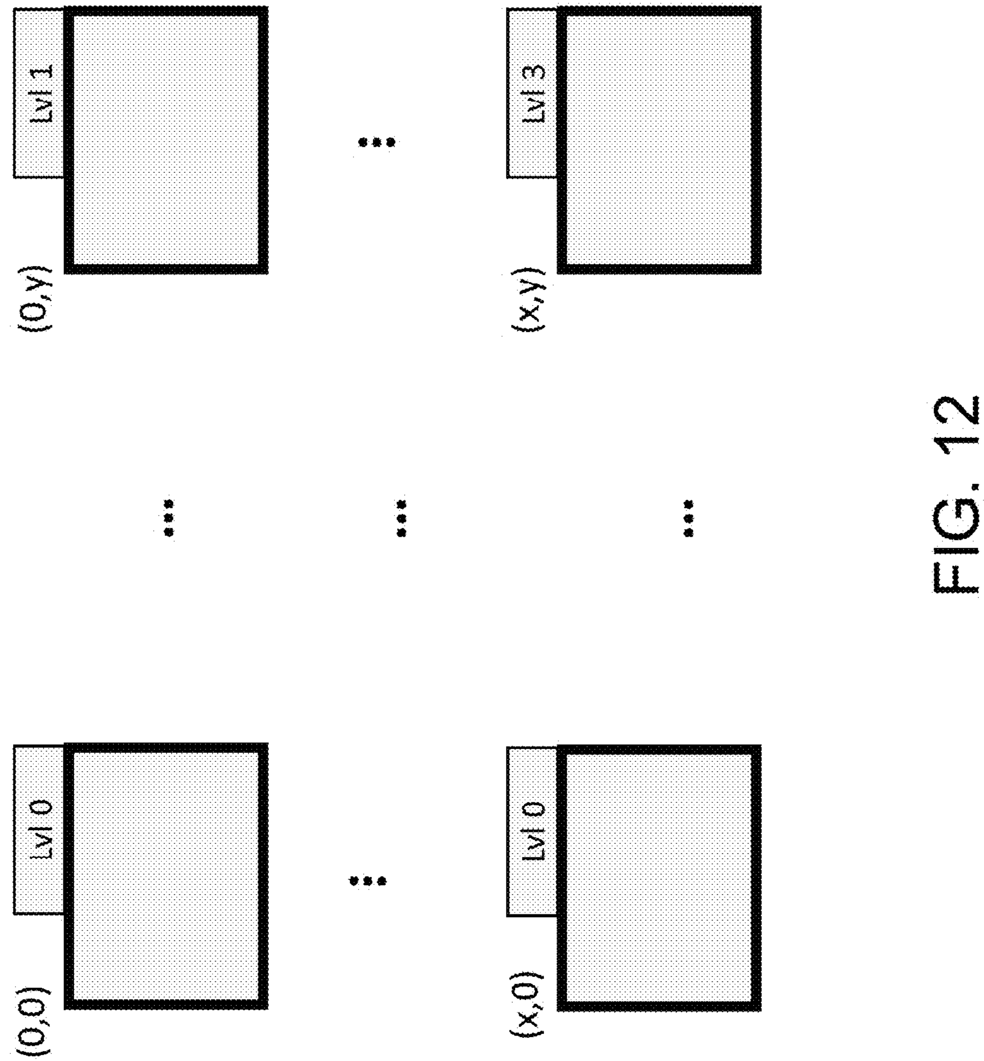
FIG. 12 schematically shows separate portions of a memory array subjected to a testing operation.

FIG. 12 schematically shows separate portions (four of which are depicted) of a memory array subjected to a testing operation. The four separate portions may be independently tested and assigned a different starting ECC protection level after testing. In this way, during testing (sort), reset ECC level protection can be allocated depending on the physical characteristics of the die (e.g., silicon quality). For example, portion (0,0) may be assigned a starting ECC protection level Lvl 0 (that may correspond to a minimum ECC correction capability, for example ECC1); portion (0,y) may be assigned a starting ECC protection level Lvl 1 (that may correspond to an intermediate ECC correction capability, for example ECC2); portion (x,0) may be assigned a starting ECC protection level Lvl 0 (e.g., ECC1); and portion (x, y) may be assigned a starting ECC protection level Lvl 3 (that may correspond to a maximum ECC correction capability, for example ECC4). Other portions (not shown) may be assigned respective starting ECC protection levels. Then, during die life, the ECC correction capability may be assigned and varied for example as shown above with reference to FIGS. 10A-10B and 11.

Alternatively or additionally, according to other embodiments of the present disclosure, the number of parity cells to be used for defining the ECC correction capability is selected by the user.

The ECC protection level may also be selected based on signals of sensors coupled to the memory array, such as sensors included in sensing unit 108. In other words, still referencing to FIG. 1, the memory device comprises one or more sensors in the sensing unit 108 which are coupled to the memory section 101 and to the controller 102. The controller 102 may thus be configured to select the number of parity cells to be used for defining the ECC correction capability based on the signals from the sensing unit 108.

Moreover, according to another embodiment, the number of parity cells apt to be used for defining the ECC correction capability is selected based on sense amplifier margin measurement. In other words, the controller may be configured to select the protection level by using sense amplifiers, such as sense amplifiers of circuit portion 105 of FIG. 1.

In this embodiment, the protection level decision based on sensing with multiple reference ensures to precisely establish when the margin is getting too small. This approach can be adopted instead of error frequency detection. In this case, the flow diagram of FIG. 11 is substantially the same but the reset value of the ECC protection level can be no ECC instead of ECC1. In fact, since sense amplifiers can anticipate margin loss, the average ECC protection level can be reduced.

As mentioned before, the memory device can integrate a dedicated hardware, e.g., integrated in the ECC unit 104 of FIG. 1, to properly assign the ECC protection level to each portion of the array.

Summing up, changing the ECC protection level is based on several trigger events, such as internal sensors, conditions, detectors, special markets, process quality, counters, depending on the specific circumstance. For instance, special markets (such as automotive, space, etc.) may require a higher ECC protection.

Figures 13A, 13B:
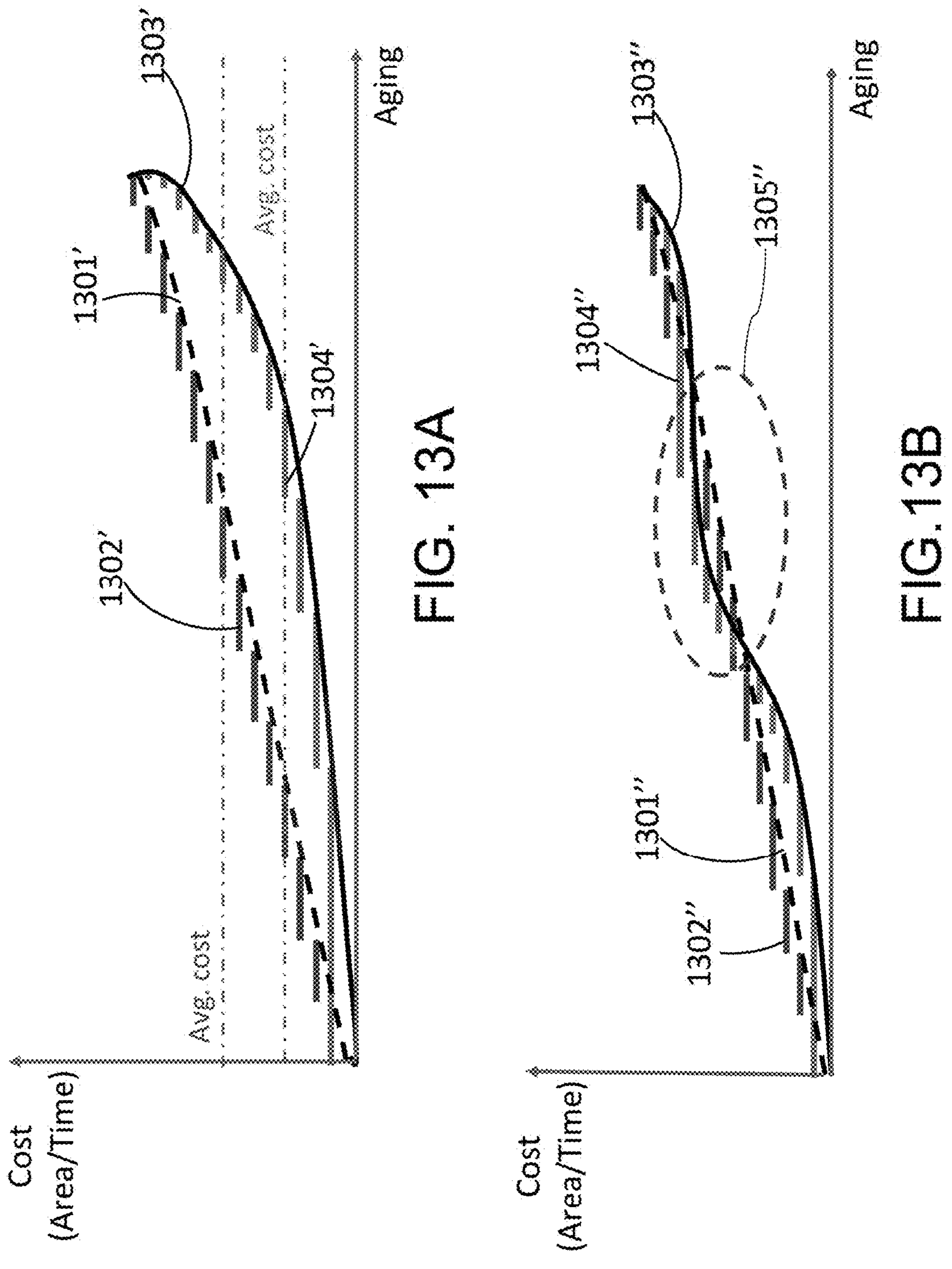
FIGS. 13A and 13B are schematic exemplary graphs representing cost of an implemented ECC protection level selection technique versus aging of the cells of the array.

The ECC unit is therefore programmed to ensure a tradeoff between simplicity and defectivity matching. FIGS. 13A and 13B show schematic exemplary graphs of the cost of the implemented ECC selection algorithm versus aging of the cells of the array. It should be noted that, despite aging is represented on the X-axis, the concepts here disclosed are not limited to cost evolution vs. aging and, rather, they apply to whichever factor that may potentially affect the Bit Error Rate of the memory cells (e.g., lapsing time, cycling, endurance, exposure to high/low temperatures, hard/soft failure mechanisms, voltage drift, etc.; accordingly aging is only one of many possible examples and the figures should be correspondingly broadly interpreted). As seen previously, it is assumed that the defect density (and therefore the required ECC correction power) increases with aging, even if different situations may occur.

More in particular, with reference to FIG. 13A, line 1301' represents an estimated defectivity trend of the cells (based on a linear defectivity increase with aging, or other parameter), while steps 1302' represent the cost trend in terms of occupied area obtained by using a lifetime-based technique for selecting the ECC protection level (e.g., by counting the number of accesses, as generally depicted in FIGS. 10A and 10B). Such an algorithm is thus based an estimated defectivity trend (e.g., the estimated defectivity trend may be obtained by defining a threshold of number access or generally of lifetime events for switching ECC protection level). On the other hand, line 1303' represents the real defectivity trend of the memory and line 1304' represents the cost of an ECC technique as based on an actual measurement and not only on the estimate thereof (e.g., based on error frequency and/or sense amplifier margin measurements or the like). The operation is thus optimized if the technique used to select the ECC protection level is defectivity-based, which better adapts to the real trend.

With reference to FIG. 13B, lines 1301", 1302", 1303" and 1304" corresponds to lines 1301', 1302', 1303' and 1304' of FIG. 13A, respectively. However, in this case, at graph portion 1305", the real defectivity trend is even worse than expected by the estimated linear scenario, so that a lifetime-based technique would yield a wrong operation of the memory, while a defectivity-based technique is able to follow the real defectivity trend with better average performances in terms of costs.

In other words, the ECC protection level is thus optimized if the algorithm used to program the controller and deciding the proper level is defectivity based and the defectivity trend is better than expected. The average cost in term of area/power/time is in fact reduced, as shown in FIG. 13A. Moreover, the ECC protection level can be too low if the defectivity is worse than expected, as shown in FIG. 13B, so that an adaptive algorithm (e.g., a technique based on error frequency, sense amplifier margin measurements etc.) optimizes the ECC protection level to the actual defectivity and improves reliability. Therefore, a proper protection level algorithm reduces average cost and improves reliability.

Depending on the particular application, a mix of some or even all the disclosed criteria to select the number of parity cells to be used may be chosen. For example, sensing with margin measurement may also be associated with error frequency measurement.

In conclusion, the present disclosure provides the introduction of a flexible ECC protection (e.g., ECC1, ECC2 and ECC3, in some embodiments) and ECC granularity (e.g., 16B, 32B and 64B, in some embodiments), which is selectable by a dedicated switch command to match the actual BER and address different performances and power requirements during the entire lifetime of a memory device. The configurable ECC techniques herein disclosed have several advantages, enabling the tracking of the actual BER during the entire lifetime of the device, offering the possibility to optimize the performance and power at any time, with a great flexibility in the protection selection. For example, according to embodiments of the present disclosure, it is possible to enable a lower ECC protection when the BER is low and increase it when the BER is higher, with the further possibility of selecting the proper ECC granularity for each status. Similarly, it is possible to use a low ECC granularity (e.g. 64B) when the BER is low and a high one (e.g. 16B) when BER is higher. The ECC correction capability and ECC granularity flexibility enables the tracking of the actual BER during the entire lifetime of the device, offering benefits in terms of performance and power at any time.

The selectable ECC correction capability and granularity is performed by considering the evolution of characteristics of the array, instead of forcing the use of the maximum protection (i.e., instead of basing the ECC on end-of-life reliability which always uses the highest ECC protection level and uses all the parity bits). According to embodiments, this is accomplished by use of the first and second registers, which allows to obtain the above-mentioned advantages in an easy and effective way.

The ECC correction capability and ECC granularity is thus variable over the lifetime of the array based on the time-varying status thereof, so that the ECC protection is adapted to the memory cells health. According to embodiments of the present disclosure, the ECC protection level is adapted to the protection needs of specific portions of the array, which are independently managed. Portion dimensions may vary from the ECC codeword up to the die. In fact, a portion may correspond to an internal subdivision like a bank group, a bank, a section or whatever other internal subdivision, or may correspond to a specification/host subdivision like a buffer, a page, or may correspond to other beneficial dimensions. In any case, the smaller the portion, the higher the benefits in terms of power consumption.

The ECC protection is thus increased only when necessary, and the corresponding ECC hardware can be switched off.

According to an exemplary embodiment, a method for operating an array of memory cells comprises the steps of storing user data in a plurality of memory cells of the array, storing parity data associated with the user data in a plurality of parity cells of the array, and, based on the stored parity data, selecting an Error Correction Code (ECC) correction capability and/or an ECC granularity according to which an ECC operation is to be performed. The selection of the ECC correction capability and/or the ECC granularity is determined by the steps of updating a first register, said first register comprising values which indicate a required ECC correction capability and/or a required ECC granularity to be applied to the memory cells based on a current status of said memory cells, wherein the values of the first register are updated based on a variation of the current status of the memory cells, and wherein an update of the values of the first register corresponds to a variation of the required ECC correction capability and/or a required ECC granularity to be applied to said memory cells, and, based on the updated values of the first register, executing an ECC switch command, wherein the ECC switch command is such as to vary a previously selected ECC correction capability and/or a previously selected ECC granularity. The method further comprises the step of updating a second register according to the varied ECC correction capability and/or ECC granularity, said second register comprising values indicating the selected ECC correction capability and the selected ECC granularity applied to the memory cells based on the current status thereof.

If not explicitly indicated, method steps are not necessarily in the disclosed sequence.

The present disclosure also relates to an apparatus comprising an array including a plurality of memory cells which are adapted to store user data, parity data, a first register and second register, and a controller comprising ECC circuitry. The controller is configured to store parity data associated with the user data in a plurality of parity cells of the array, and, based on the stored parity data, select an Error Correction Code (ECC) correction capability by activating an ECC engine of the ECC circuitry, and/or select an ECC granularity on which the ECC engine operates. In order to select the ECC correction capability and/or the ECC granularity, the controller is configured to receive information from the first register, said first register comprising values indicating a required ECC correction capability and/or a required ECC granularity to be applied to the memory cells based on a current status of said memory cells, wherein the first register is configured to be updated based on a variation of the current status of the memory cells, and wherein an update of the values of the first register corresponds to a variation of the required ECC correction capability and/or a required ECC granularity to be applied to the memory cells, and, based on the updated values of the first register, enable an ECC switch command, wherein the ECC switch command comprises command instructions to cause the selection of the ECC correction capability and/or ECC granularity to be applied to the memory cells based on the required ECC correction capability and/or the required ECC granularity of the first register. The controller is further configured to write data information into the second register, said second register comprising values indicating the selected ECC correction capability and the selected ECC granularity applied to the memory cells based on the current status thereof.

The present disclosure also relates to a managed memory system comprising a memory section including a plurality of memory cells which are adapted to store user data, parity data, at least one a first register and second register, and a controller operatively coupled to the memory section. The controller is configured to store parity data associated with the user data in a plurality of parity cells, and based on data information of the first register, select an Error Correction Code (ECC) correction capability and/or an ECC granularity on which an ECC engine of the managed memory system operates, and write data information into the second register, said second register comprising values indicating the selected ECC correction capability and the selected ECC granularity currently applied to the memory cells. The controller is configured to communicate with the memory section to receive information from the first register, said first register comprising values indicating a required ECC correction capability and/or a required ECC granularity to be applied to the memory cells based on the current status of said memory cells, wherein the managed memory system is configured to update the first register based on a variation of the current status of the memory cells, and wherein an update of the values of the first register corresponds to a variation of the required ECC correction capability and/or a required ECC granularity to be applied to the memory cells, and, upon receiving the updated values of the first register, decide if enable or not an ECC switch command, wherein the ECC switch command comprises command instructions to cause the variation of a previously selected ECC correction capability and/or ECC granularity based on the required ECC correction capability and/or the required ECC granularity of the first register.

A general system, comprising a host device and a memory device as above is also disclosed, the general system comprising for example any of a display communicatively coupled to the memory device or to the host, a network interface communicatively coupled to the memory device or to the host, and a battery coupled to provide power to said general system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause-and-effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. An apparatus, comprising:

an array of memory cells configured to store user data and corresponding parity data; and a controller coupled to the array and comprising error correction code (ECC) circuitry, wherein the controller is configured to:

receive first information from a first register, the first register being configured to be updated based on a variation of a current status of group of memory cells, wherein updated values of the first information correspond to a variation of a current ECC correction capability and/or a current ECC granularity to be applied to a group of memory cells;

based on receiving updated first information from the first register, enable an ECC switch command to:

cause a selection of a particular ECC correction capability and/or a particular ECC granularity corresponding to the updated first information; and update second information stored in a second register, wherein the second information corresponds to the current ECC correction capability and/or the current ECC granularity to be applied to the group of memory cells such that updating the second information involves replacing the current ECC correction capability and/or the current ECC granularity with the particular ECC correction capability and/or the particular ECC granularity.

2. The apparatus of claim 1, wherein the ECC circuitry comprises at least three different engines corresponding to different respective ECC correction capabilities.

3. The apparatus of claim 1, wherein the first register and the second register are located in the array of memory cells.

4. The apparatus of claim 1, wherein the controller comprises at least two counters associated with determining the variation of the current status of the group of memory cells.

5. The apparatus of claim 4, wherein the at least two counters include a first counter configured to count at least one of a number of accesses to the memory cells or a number of refresh events or a number of power-up events or a combination thereof, wherein the controller is configured to select the particular ECC correction capability and/or the particular ECC granularity based on a value of the first counter.

6. The apparatus of claim 5, wherein the at least two counters include a second counter configured to count a number of errors detected, wherein the controller is configured to select the particular ECC correction capability and/or the particular ECC granularity based on a counted error frequency.

7. The apparatus of claim 1, wherein the controller is configured to prevent read and/or write operations of the array during execution of the switch command.

8. The apparatus of claim 1, wherein the controller is configured to allow read and/or write operations of the array during execution of the ECC switch command, wherein, during the execution of the ECC switch command, the controller is further configured to apply a previously selected ECC correction capability and/or ECC granularity to the array.

9. The apparatus of claim 1, wherein the apparatus comprises a solid state drive.

10. The apparatus of claim 1, wherein the array comprises NAND memory cells.

11. A method, comprising:

storing user data and corresponding parity data in an array of memory cells;

receiving, at a controller coupled to the array and comprising error correction code (ECC) circuitry, first information from a first register, the first register being configured to be updated based on a variation of a current status of group of memory cells, wherein updated values of the first information correspond to a variation of a current ECC correction capability and/or a current ECC granularity to be applied to a group of memory cells;

based on receiving updated first information from the first register, executing an ECC switch command to:

cause a selection of a particular ECC correction capability and/or a particular ECC granularity corresponding to the updated first information; and update second information stored in a second register, wherein the second information corresponds to the current ECC correction capability and/or the current ECC granularity to be applied to the group of memory cells such that updating the second information involves replacing the current ECC correction capability and/or the current ECC granularity with the particular ECC correction capability and/or the particular ECC granularity.

12. The method of claim 11, comprising grouping the memory cells of the array into a plurality of portions, each portion of the plurality of portions being independently assigned a specific ECC correction capability and/or a specific ECC granularity based on the current status of the memory cells thereof.

13. The method of claim 11, further comprising preventing read and/or write operations from being performed on the array during the execution of the ECC switch command.

14. The method of claim 11, further comprising allowing read and/or write operations are allowed on the array during the execution of the ECC switch command, wherein, during the execution of the ECC switch command, using a previously selected ECC correction capability and/or ECC granularity.

15. The method of claim 11, further comprising selecting the ECC correction capability and/or the ECC granularity based on a value of a first counter used to count: a number of accesses to the memory cells, or a number of refresh events, or a number of power-up events, or a combination thereof, the value of the first counter indicating the current status of the memory cells.

16. The method of claim 11, wherein the method includes selecting, for each defined status of the memory cells, a specific combination of ECC correction capability, ECC granularity, and write/read data access granularity to apply to the memory cells.

17. An apparatus, comprising:

memory cells adapted to store user data, parity data, a first register, and a second register; and a controller configured to:

based on first information stored in the first register, select an error correction code (ECC) correction capability and/or an ECC granularity on which an ECC engine of the apparatus operates;

write second information into the second register, the second register storing values indicating the selected ECC correction capability and the selected ECC granularity currently applied to the memory cells;

receive the first information from the first register, the first register storing values indicating a particular ECC correction capability and/or a particular ECC granularity to be applied to the memory cells based on a current status of the memory cells, wherein the first register is configured to be updated based on a variation of the current status of the memory cells, and wherein an update of the values of the first register corresponds to a variation of the particular ECC correction capability and/or the particular ECC granularity to be applied to the memory cells; and upon receiving the updated values of the first register, determine whether or not to enable an ECC switch command, wherein the ECC switch command is executable to cause the variation of a previously selected ECC correction capability and/or ECC granularity based on the particular ECC correction capability and/or the particular ECC granularity of the first register.

18. The apparatus of claim 17, wherein the stored parity data corresponds to a plurality of different selectable ECC correction capabilities and ECC granularities.

19. The apparatus of claim 17, wherein the first register comprises a plurality of sections, each section of the plurality of sections containing information for a respective portion of an array comprising the memory cells, the values of one section being updated independently from the values of the other sections according to the status of the memory cells of the respective portion.

20. The apparatus of claim 19, wherein the second register comprises a plurality of sections, each section of the plurality of sections containing information for a respective portion of the array, the values of one section being updated independently from the values of the other sections according to the selected the ECC correction capability and/or ECC granularity.

* * * * *